United States Patent
Park et al.

(10) Patent No.: US 11,508,796 B2
(45) Date of Patent: Nov. 22, 2022

(54) DISPLAY DEVICE WITH PIXEL ELECTRODE CONNECTED TO ELECTRODE PATTERN AND PROTECTIVE LAYER

(71) Applicant: Samsung Display Co., LTD., Yongin-si (KR)

(72) Inventors: Jun Hyun Park, Suwon-si (KR); Dong Woo Kim, Yongin-si (KR); Kang Moon Jo, Hwaseong-si (KR); Sung Jae Moon, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 245 days.

(21) Appl. No.: 16/886,075

(22) Filed: May 28, 2020

(65) Prior Publication Data

US 2021/0020725 A1    Jan. 21, 2021

(30) Foreign Application Priority Data

Jul. 16, 2019    (KR) .......................... 10-2019-0085931

(51) Int. Cl.
*H01L 27/32* (2006.01)

(52) U.S. Cl.
CPC ........ *H01L 27/3276* (2013.01); *H01L 27/326* (2013.01); *H01L 27/3246* (2013.01)

(58) Field of Classification Search
CPC ............. H01L 27/3276; H01L 27/3246; H01L 27/326

See application file for complete search history.

(56) References Cited

U.S. PATENT DOCUMENTS

| | | | | |
|---|---|---|---|---|
| 10,573,698 | B2* | 2/2020 | Lee | H01L 29/78645 |
| 2005/0051776 | A1* | 3/2005 | Miyagi | H01L 27/3276 |
| | | | | 257/72 |
| 2014/0097455 | A1* | 4/2014 | Ono | H01L 27/124 |
| | | | | 257/306 |
| 2016/0093647 | A1* | 3/2016 | Kim | G02F 1/136227 |
| | | | | 257/40 |
| 2017/0148856 | A1* | 5/2017 | Choi | H01L 27/3258 |
| 2018/0350886 | A1* | 12/2018 | An | H01L 27/3246 |

FOREIGN PATENT DOCUMENTS

KR    10-2018-0036855    4/2018

* cited by examiner

*Primary Examiner* — Lex H Malsawma
(74) *Attorney, Agent, or Firm* — Kile Park Reed & Houtteman PLLC

(57) ABSTRACT

A display device including a substrate including a display area and an opening area therein, a data conductive layer on the substrate and including a source electrode and a voltage wiring in the opening area, a protective layer on the data conductive layer and covering the source electrode and the voltage wiring, a pixel electrode layer including a pixel electrode connected to the source electrode through a first contact hole, and an electrode pattern connected to the voltage wiring through a second contact hole, a pixel defining layer including an opening exposing the pixel electrode and a hole exposing the electrode pattern, a light emitting layer on the pixel defining layer and a common electrode on the light emitting layer, wherein the hole does not overlap the first and second contact holes.

20 Claims, 22 Drawing Sheets

CFL : CFL1, CFL2, CFL3
WCL : WCL1, WCL2

1100: 1110, 1120, 1130
1200: 1210, 1220, 1250, 1260
1300: 1310, 1320, 1330, 1350, 1360, 1370, 1380, 1390

1400: 1410, 1420, 1430, 1450, 1460, 1470, 1480
OPH: OPH1, OPH2, OPH3
PXE: PXE1, PXE2, PXE3

DISPLAY DEVICE WITH PIXEL ELECTRODE CONNECTED TO ELECTRODE PATTERN AND PROTECTIVE LAYER

CROSS-REFERENCE TO RELATED APPLICATION

This application claims priority to and benefits of Korean Patent Application No. 10-2019-0085931 under 35 U.S.C. § 119, filed in the Korean Intellectual Property Office on Jul. 16, 2019, the entire contents of which are incorporated herein by reference.

BACKGROUND

1. Technical Field

The disclosure relates to a display device providing uniformity of a driving voltage to be applied to each of pixels thereof.

2. Description of the Related Art

Electronic devices that provide images to a user, such as televisions, smartphones, tablet personal computers (PCs), digital cameras, notebook computers and navigation devices, include a display device for displaying images.

The display device may include a display panel such as an organic light emitting display panel or a liquid crystal display panel as a device for displaying images of the display device. Among these display panels, a light emitting display panel may include light emitting elements such as light emitting diodes (LEDs). Examples of the LEDs may include organic LEDs using an organic material as a fluorescent material and inorganic LEDs using an inorganic material as a fluorescent material.

Such a display device may include a display panel, a gate driving circuit, a data driving circuit, and a timing controller. The display panel may include data lines, gate lines, and pixels formed at intersections of the data lines and the gate lines. By using a thin-film transistor as a switching element, each of the pixels may receive a data voltage from a data line in a case that a gate signal may be supplied to a gate line. Each of the pixels may emit light of a predetermined brightness level according to the data voltage.

Display devices capable of displaying ultra-high definition (UHD) images continue to be developed. Since a high-resolution display device may include numerous pixels, a driving voltage applied to each pixel may not be uniform. As a result, a low voltage may be applied to some of the pixels.

SUMMARY

Aspects of the disclosure provide a display device which may include electrode patterns which may have the same electric potential as a power supply voltage and which may contact a common electrode.

However, aspects of the disclosure may not be restricted to the ones set forth herein. The above and other aspects of the disclosure will become more apparent to one of ordinary skill in the art to which the disclosure pertains by referencing the detailed description below.

According to an embodiment of the disclosure, a display device may include a substrate including a display area and an opening area located in the display area, a data conductive layer disposed on the substrate, and including a source electrode disposed in the display area and a voltage wiring disposed in the opening area, a protective layer disposed on the data conductive layer, and covering the source electrode and the voltage wiring, a planarization layer disposed on the protective layer, a pixel electrode layer disposed on the planarization layer, and including a pixel electrode connected to the source electrode through a first contact hole penetrating the planarization layer and the protective layer, and an electrode pattern connected to the voltage wiring through a second contact hole penetrating the planarization layer and the protective layer, a pixel defining layer disposed on the planarization layer and the pixel electrode layer, and including an opening exposing a portion of the pixel electrode and a hole at least partially exposing the electrode pattern, a light emitting layer disposed on the pixel defining layer and a common electrode disposed on the light emitting layer, wherein the hole does not overlap the first contact hole and the second contact hole in a thickness direction of the display device.

The electrode pattern may include a first expanded portion having a first width and a protruding portion protruding from a side of the first expanded portion and having a width smaller than the first width.

The first width of the first expanded portion of the electrode pattern may be greater than a second width of the hole.

The second width of the hole may be greater than a third width of the second contact hole.

The third width of the second contact hole may be different from a fourth width of the first contact hole.

The hole may overlap the first expanded portion of the electrode pattern in the thickness direction of the display device.

The second contact hole may overlap the protruding portion of the electrode pattern in the thickness direction of the display device.

The electrode pattern may not overlap the first contact hole in the thickness direction of the display device.

The voltage wiring may include a second expanded portion overlapping the first expanded portion in the thickness direction of the display device, and a first extension portion extending from a side of the second expanded portion, and the second contact hole may overlap the first extension portion of the voltage wiring in the thickness direction of the display device.

The electrode pattern may include a first electrode pattern having at least a portion thereof exposed by the hole and a second electrode pattern not exposed by the hole, and the common electrode may contact the first electrode pattern and not contact the second electrode pattern.

The light emitting layer may be disposed between the common electrode and the pixel electrode exposed by the opening and may be not disposed on the first electrode pattern exposed by the hole.

The voltage wiring may include a first voltage wiring connected to the first electrode pattern and a second voltage wiring connected to the second electrode pattern.

The data conductive layer may include a first data conductive layer and a second data conductive layer disposed on the first data conductive layer, and the protective layer may include a first protective layer disposed between the first data conductive layer and the second data conductive layer, and a second protective layer disposed between the second data conductive layer and the planarization layer.

The second data conductive layer may be connected to the first data conductive layer through a third contact hole penetrating the first protective layer.

The third contact hole may not overlap the second contact hole in the thickness direction of the display device.

The pixel electrode may contact the source electrode of the second data conductive layer through the first contact hole, and the electrode pattern may contact the voltage wiring of the second conductive layer through the second contact hole.

The display device may include a first electrode pad disposed on the second protective layer and the second data conductive layer, and which contacts the source electrode of the second data conductive layer, and a second electrode pad disposed on the second protective layer and the second data conductive layer, and which contacts the voltage wiring of the second data conductive layer, wherein the pixel electrode may contact the first electrode pad, and the electrode pattern may contact the second electrode pad.

According to another embodiment of the disclosure, a display device may include pixels, each of which may define an opening area, a voltage wiring disposed in the opening areas of the respective pixels, and including a first expanded portion and a first extension portion extending from a side of the first expanded portion, an electrode pattern disposed in the opening areas of the respective pixels, and including a second expanded portion overlapping the first expanded portion in a thickness direction of the display device, and a protruding portion protruding from a side of the second expanded portion, a pixel defining layer disposed on the second expanded portion of the electrode pattern, and including a hole exposing at least a portion of the second expanded portion, and a common electrode disposed on the pixel defining layer, and which contacts the exposed second expanded portion of the electrode pattern, wherein the voltage wiring and the electrode pattern may be connected to each other through a contact hole, and the contact hole and the hole do not overlap each other in the thickness direction of the display device.

A width of the hole may be smaller than a width of the second expanded portion of the electrode pattern and greater than a width of the contact hole.

The contact hole may overlap the protruding portion of the electrode pattern and the first extension portion of the voltage wiring, and the protruding portion of the electrode pattern may be connected to the first extension portion of the voltage wiring.

BRIEF DESCRIPTION OF THE DRAWINGS

The above and other features and advantages of the disclosure will become more apparent by describing in detail embodiments thereof with reference to the accompanying drawings, in which.

DETAILED DESCRIPTION OF THE EMBODIMENTS

Figure 1:
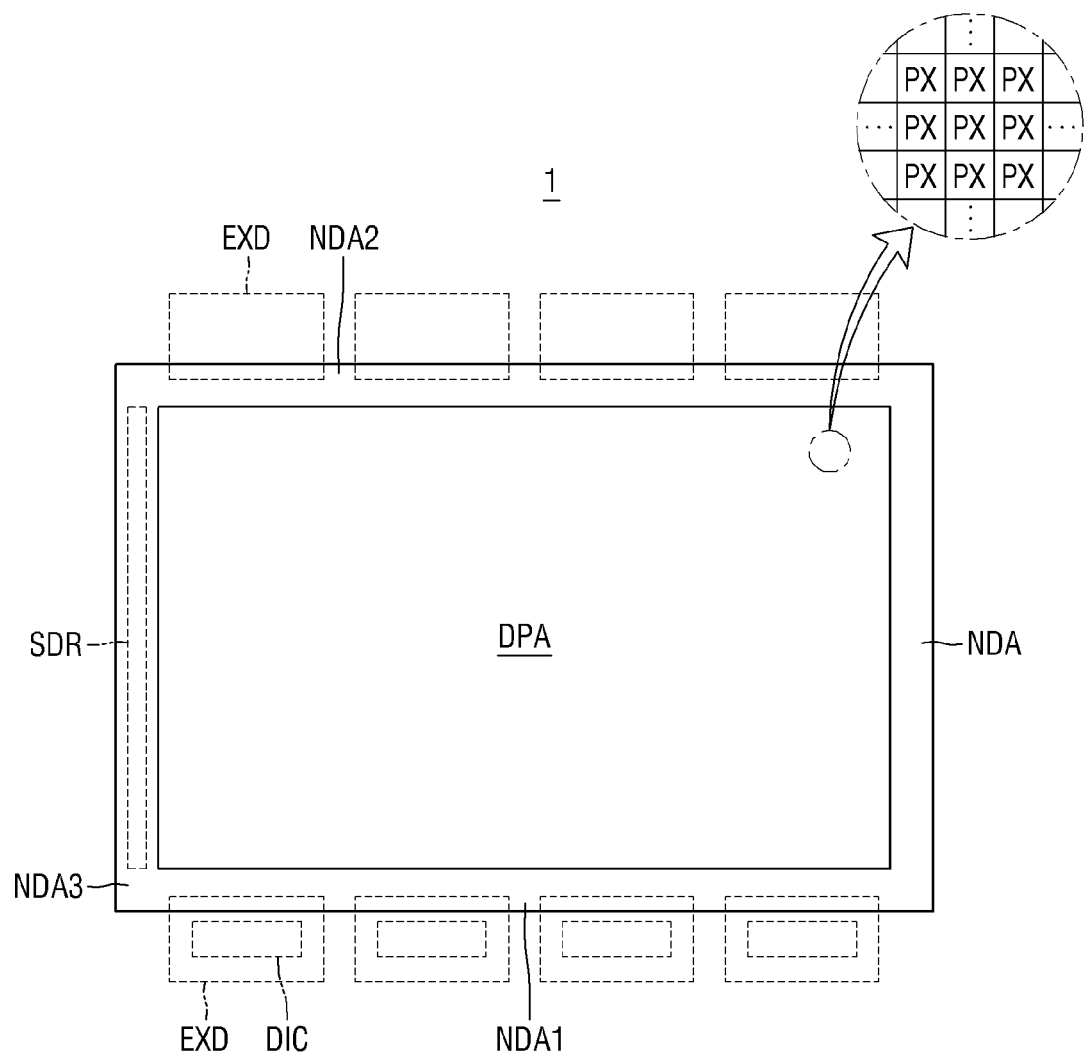
FIG. 1 shows a plan view of a display device according to an embodiment.

Embodiments of the disclosure will now be described more fully hereinafter with reference to the accompanying drawings. The embodiments may, however, be embodied in different forms and should not be construed as limited to descriptions thereof as set forth herein. Rather, these embodiments may be provided so that this disclosure will be thorough and complete, and will fully convey the scope thereof to those skilled in the art.

It will also be understood that when a layer is referred to as being "on" another layer or substrate, it may be directly on the other layer or substrate, or intervening layers may also be present. The same reference numbers indicate the same components throughout the disclosure. The word "over" or "on" means positioning on or below an object portion, and does not necessarily mean positioning on the upper side of the object portion based on a gravity direction.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings herein. Similarly, the second element could also be termed the first element.

Further, since sizes and thicknesses of constituent members shown in the accompanying drawings may be arbitrarily given for better understanding and ease of description, embodiments may not be limited to the illustrated sizes and thicknesses. In the drawings, the thicknesses of layers, films, panels, regions, etc., may be exaggerated for clarity. In the drawings, for better understanding and ease of description, the thicknesses of some layers and areas may be exaggerated.

Unless explicitly described to the contrary, the word "comprise" and variations such as "comprises" or "comprising" will be understood to imply the inclusion of stated elements but not the exclusion of any other elements. As used herein, the term "and/or" may include any and all combinations of one or more of the associated listed items. Expressions such as "at least one of," when preceding a list of elements, modify the entire list of elements and do not modify the individual elements of the list.

In a case that a certain embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within, for example, 30%, 20%, or 5% of the stated value.

As used herein, the singular forms "a," "an," and "the" are intended to include the plural forms as well, unless the context clearly indicates otherwise.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it may be directly or indirectly in contact with or electrically connected to the other element, area, or layer.

Further, the phrase "in a plan view" means when an object portion is viewed from above, and the phrase "in a cross-sectional view" means when a cross-section taken by vertically cutting an element portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art. When a layer, region, substrate, or area, is referred to as being "on" another layer, region, substrate, or area, it may be directly on the other region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the description.

FIG. 1 shows a plan view of a display device according to an embodiment.

The display device 1 may include any electronic device that provides a display screen. The display device 1 may include televisions, notebook computers, monitors, billboards, mobile phones, smartphones, tablet personal computers (PCs), electronic watches, smart watches, watch phones, mobile communication terminals, electronic notebooks, electronic books, portable multimedia players (PMPs), navigation devices, game machines, digital cameras, and devices used within the Internet of Things, all of which may provide a display screen.

The display device 1 illustrated in the drawing may be a television. The display device 1 may have high resolution or ultra-high resolution such as, but not limited to, high definition (HD), ultra-high definition (UHD), 4K, or 8K.

The display device 1 may be classified variously according to its display method. For example, the display device 1 may be classified as an organic light emitting display device, an inorganic electroluminescent (EL) display device, a quantum dot light emitting display device (QED), a light emitting diode (LED) display device, a plasma display panel (PDP), a field emission display device (FED), a cathode ray tube (CRT) display device, a liquid crystal display device (LCD), or an electrophoretic display device (EPD). An organic light emitting display device may employ a display device as described herein. However, embodiments may not be limited to an organic light emitting display device. Instead, various types of display devices mentioned above or known in the art may employ, include or be implemented with a display device described herein within the scope of the technical spirit.

The display device 1 may be rectangular in plan view. In a case that the display device 1 is, for example, a television, its long sides may usually be placed in a horizontal direction. However, embodiments may not be limited as such, and the long sides may also be placed in a vertical direction. In other embodiments, the display device 1 may be rotatably installed so that its long sides may be variably placed either in the horizontal or vertical direction.

The display device 1 may include a display area DPA and a non-display area NDA. The display area DPA may be an active area where an image may be displayed. The display area DPA may have a rectangular planar shape similar to the overall shape of the display device 1.

The display area DPA may include pixels PX. The pixels PX may be arranged in a matrix direction or matrix form. Each of the pixels PX may be rectangular or square in plan view. However, the shape of each of the pixels PX may not be limited to the rectangular or square shape and may also be a rhombic shape having each side inclined to a side of the display device 1. The pixels PX may include pixels PX of various colors. For example, the pixels PX may include a first color pixel PX of a red color, a second color pixel PX of a green color, and a third color pixel PX of a blue color. The color pixels PX may be arranged in a stripe type or a pentile type.

The non-display area NDA may be disposed around the display area DPA. The non-display area NDA may completely or partially surround the display area DPA. The display area DPA may be rectangular, and the non-display area NDA may be disposed adjacent to four sides of the display area DPA. The non-display area NDA may form a bezel of the display device 1.

A driving circuit or element for driving the display area DPA may be disposed in the non-display area NDA. A pad portion may be provided on a display substrate of the display device 1 in a first non-display area NDA1 disposed adjacent to a first long side (e.g., a lower side in FIG. 1) of the display device 1 and a second non-display area NDA2 disposed adjacent to a second long side (e.g., an upper side in FIG. 1) of the display device 1, and external devices EXD may be mounted on pad electrodes of the pad portion. The external devices EXD may include connection films, printed circuit boards, driver chips (DICs), connectors, and wiring connection films. A scan driver SDR directly or indirectly formed on the display substrate of the display device 1 may be disposed in a third non-display area NDA3 disposed adjacent to a first short side (e.g., a left side in FIG. 1) of the display device 1.

Figure 2:
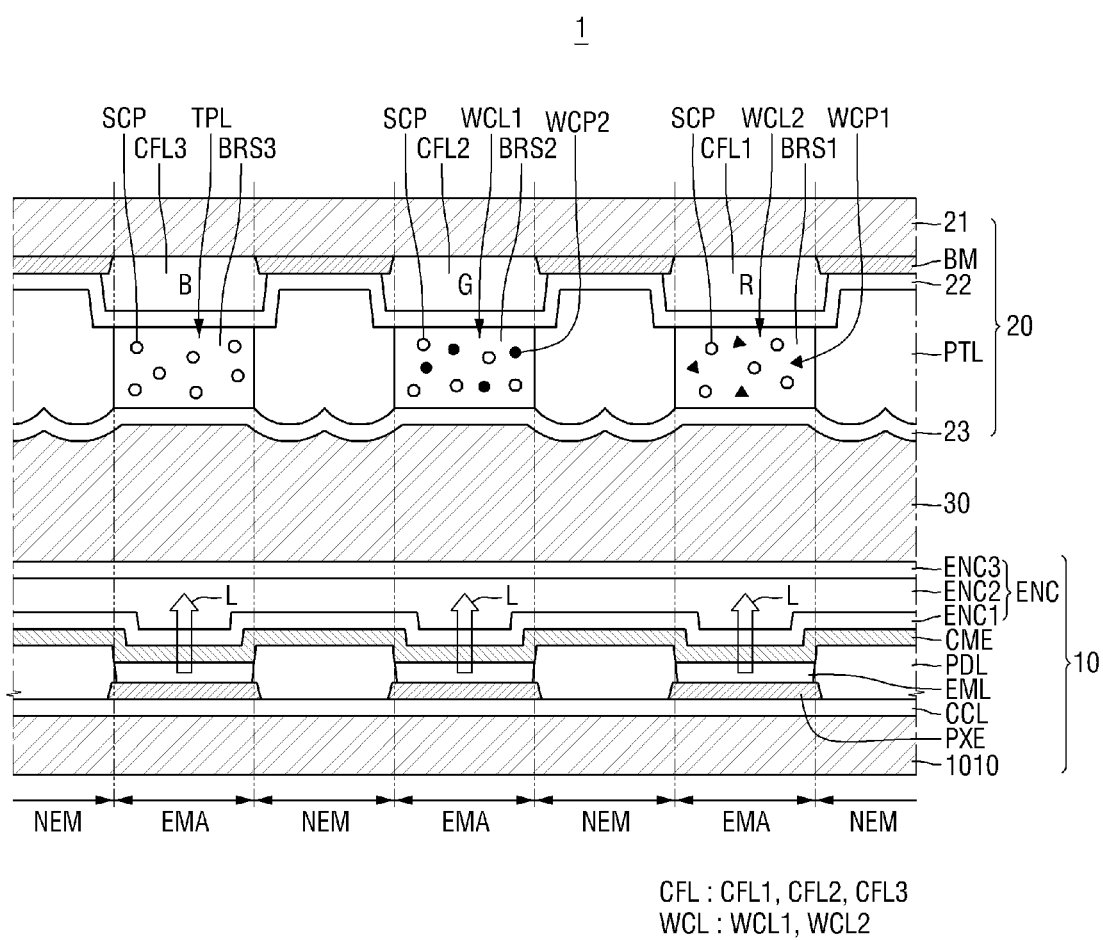
FIG. 2 shows a schematic cross-sectional view of the display device according to the embodiment.

FIG. 2 shows a schematic cross-sectional view of the display device 1 according to the embodiment.

In FIG. 2, the display device 1 includes a top emission display device in which light L is emitted not toward a first substrate 1010 having a light emitting layer EML but in an opposite direction (i.e., toward a second substrate 21). However, the display device 1 may not be limited to the top emission display device.

Referring to FIG. 2, the display device 1 may include the light emitting layer EML, an encapsulation layer ENC covering the light emitting layer EML, and a color control structure WCL, TPL and CFL disposed on the encapsulation layer ENC. The display device 1 may include a first display substrate 10 and a second display substrate 20 facing the first display substrate 10. The light emitting layer EML, the encapsulation layer ENC, and the color control structure WCL, TPL and CFL may be included in any one of the first display substrate 10 and the second display substrate 20.

The first display substrate 10 may include the first substrate 1010, the light emitting layer EML disposed on a surface of the first substrate 1010, and the encapsulation layer ENC disposed on the light emitting layer EML. The second display substrate 20 may include the second substrate 21 and the color control structure WCL, TPL and CFL disposed on a surface of the second substrate 21 which faces the first substrate 1010. The color control structure WCL, TPL and CFL may include a color filter layer CFL and a wavelength conversion layer WCL. The color control structure WCL, TPL and CFL may include a light transmitting layer TPL disposed at the same level as the wavelength conversion layer WCL in some pixels.

A filling layer 30 may be disposed between the encapsulation layer ENC and the color control structure WCL, TPL and CFL. The filling layer 30 may fill a space between the first display substrate 10 and the second display substrate 20 and bond the first display substrate 10 and the second display substrate 20 together.

The first substrate 1010 of the first display substrate 10 may be an insulating substrate. The first substrate 1010 may include a transparent material. For example, the first substrate 1010 may include a transparent insulating material such as glass or quartz. The first substrate 1010 may be a rigid substrate. However, the first substrate 1010 may not be limited to the above. The first substrate 1010 may also include plastic such as polyimide and may have flexible properties so that it may be curved, bent, folded, or rolled.

Pixel electrodes PXE may be disposed on the surface of the first substrate 1010. The pixel electrodes PXE may be disposed in the pixels PX, respectively. The pixel electrodes PXE of neighboring pixels PX may be separated from each other. A circuit layer CCL for driving the pixels PX may be disposed on the first substrate 1010. The circuit layer CCL may be disposed between the first substrate 1010 and the pixel electrodes PXE. The pixel electrodes PXE may be first electrodes, e.g., anodes of LEDs. Each of the pixel electrodes PXE may have a stacked structure in which a material layer having a high work function including, but not limited to, indium-tin-oxide (ITO), indium-zinc-oxide (IZO), zinc oxide (ZnO) or indium oxide ($In_2O_3$) and a reflective material layer including, but not limited to, silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture of the same are stacked. The material layer having a high work function may be disposed on the reflective material layer so as to be close to a light emitting layer EML. The pixel electrodes PXE may have a multilayer structure of, but not limited to, ITO/Mg, ITO/MgF, ITO/Ag, or ITO/Ag/ITO.

A pixel defining layer PDL may be formed on the surface of the first substrate 1010 along a boundary of each pixel PX. The pixel defining layer PDL may be disposed on the pixel electrodes PXE and include openings exposing the pixel electrodes PXE. The pixel defining layer PDL and the openings may define emission areas EMA and a non-emission area NEM. The pixel defining layer PDL may include an organic insulating material such as, but not limited to, polyacrylates resin, epoxy resin, phenolic resin, polyamides resin, polyimides resin, unsaturated polyesters resin, polyphenylenethers resin, polyphenylenesulfides resin or benzocyclobutene (BCB). The pixel defining layer PDL may include an inorganic material.

The light emitting layer EML may be disposed on the pixel electrodes PXE exposed by the pixel defining layer PDL. In an embodiment in which the display device 1 may be an organic light emitting display device, the light emitting layer EML may include an organic layer including an organic material. The organic layer may include an organic light emitting layer and, in some cases, may include a hole injection/transport layer and/or an electron injection/transport layer as an auxiliary layer for assisting light emission. In a case that the display device 1 may be an LED display device, the light emitting layer EML may include an inorganic material such as an inorganic semiconductor.

The light emitting layer EML may have a tandem structure that includes organic light emitting layers overlapping or facing each other in a thickness direction and a charge generation layer disposed between the organic light emitting layers. The organic light emitting layers may emit light of the same wavelength but may also emit light of different wavelengths.

The wavelength of light emitted from each light emitting layer EML may be the same for each color pixel PX. For example, the light emitting layer EML of each color pixel PX may emit blue light or ultraviolet light, and the color control structure WCL, TPL and CFL may include the wavelength conversion layer WCL to display the color of each pixel PX.

The wavelength of light emitted from each light emitting layer EML may be different for each color pixel PX. For example, the light emitting layer EML of the first color pixel PX may emit light of a first color, the light emitting layer EML of the second color pixel PX may emit light of a second color, and the light emitting layer EML of the third color pixel PX may emit light of a third color. The light emitting layer EML may be disposed on the entire surfaces of the pixel electrodes PXE and the pixel defining layer PDL. However, embodiments may not be limited to thereto, and the light emitting layer EML may also be disposed to correspond to the openings of the pixel defining layer PDL and may not be partially disposed in areas other than the aforementioned openings.

A common electrode CME may be disposed on the light emitting layer EML. The common electrode CME may contact not only the light emitting layer EML but also an upper surface of the pixel defining layer PDL.

The common electrode CME may be formed as a single electrode extending continuously over each of the pixels PX. The common electrode CME may be a whole-surface electrode disposed over the pixels PX. The common electrode CME may be a second electrode, e.g., a cathode of each LED.

The common electrode CME may include a material layer having a small work function including, but not limited to, Li, Ca, LiF/Ca, LiF/Al, Al, Mg, Ag, Pt, Pd, Ni, Au, Nd, Ir, Cr, BaF, Ba, or a compound or mixture of the same (e.g., a mixture of Ag and Mg). The common electrode CME may include a transparent metal oxide layer disposed on the material layer having a small work function.

A pixel electrode PXE, a light emitting layer EML, and the common electrode CME may constitute each light emitting element (e.g., each organic light emitting element). Light emitting from the light emitting layer EML may be output upward through the common electrode CME.

The encapsulation layer ENC may be disposed on the common electrode CME. The encapsulation layer ENC may include one or more encapsulation layers. For example, the encapsulation layers may include a first inorganic layer ENC1, an organic layer ENC2, and a second inorganic layer ENC3. Each of the first inorganic layer ENC1 and the second inorganic layer ENC3 may include, but not limited to, silicon nitride, silicon oxide, silicon oxynitride, or a combination thereof. The organic layer ENC2 may include an organic insulating material such as, but not limited to, polyacrylates resin, epoxy resin, phenolic resin, polyamides resin, polyimides resin, unsaturated polyesters resin, polyphenylenethers resin, polyphenylenesulfides resin, benzocyclobutene (BCB), or a combination thereof.

The second display substrate 20 may be disposed above the encapsulation layer ENC to face the encapsulation layer ENC. The second substrate 21 of the second display substrate 20 may include a transparent material. The second substrate 21 may include a transparent insulating material such as glass or quartz. The second substrate 21 may be a rigid substrate. However, the second substrate 21 may not be limited thereto. The second substrate 21 may also include plastic such as polyimide and may have flexible properties so that it may be curved, bent, folded, or rolled.

The second substrate 21 may be the same as the first substrate 1010 but may also be different from the first substrate 1010 in material, thickness, transmittance, and the like. For example, the second substrate 21 may have higher transmittance than the first substrate 1010. The second substrate 21 may be thicker than the first substrate 1010 or may be thinner than the first substrate 1010.

A light blocking member BM may be disposed along the boundary of each pixel PX on the surface of the second substrate 21 which faces the first substrate 1010. The light blocking member BM may overlap or face the pixel defining layer PDL of the first display substrate 10 and may be located in the non-emission area NEM. The light blocking member BM may include openings which expose the surface of the second substrate 21 overlapping or facing the emission areas EMA. The light blocking member BM may be formed in a lattice shape in plan view.

The light blocking member BM may include an organic material. The light blocking member BM may reduce color distortion due to reflection of external light by absorbing the external light. The light blocking member BM may prevent light emitted from the light emitting layer EML of each pixel PX from intruding into an adjacent pixel PX.

The light blocking member BM may absorb all visible light wavelengths. The light blocking member BM may include a light absorbing material. For example, the light blocking member BM may be made of a material used as a black matrix of the display device 1.

The color filter layer CFL may be disposed on the surface of the second substrate 21 that may include the light blocking member BM. The color filter layer CFL may be disposed on the surface of the second substrate 21 to be exposed through the openings of the light blocking member BM. The color filter layer CFL may be disposed on a portion of the adjacent light blocking member BM.

The color filter layer CFL may include a first color filter layer CFL1 disposed in the first color pixel PX, a second color filter layer CFL2 disposed in the second color pixel PX, and a third color filter layer CFL3 disposed in the third color pixel PX. Each color filter layer CFL1, CFL2 or CFL3 may include a colorant such as a dye or pigment that absorbs wavelengths other than a corresponding color wavelength. The first color filter layer CFL1 may be a red color filter layer, the second color filter layer CFL2 may be a green color filter layer, and the third color filter layer CFL3 may be a blue color filter layer. Neighboring color filter layers disposed on the light blocking member BM may be spaced apart from each other, or may overlap or at least partially overlap each other.

A first capping layer 22 may be disposed on the color filter layer CFL. The first capping layer 22 may prevent impurities such as moisture or air from being introduced from the outside and damaging or contaminating the color filter layer CFL. The first capping layer 22 may prevent the colorant of the color filter layer CFL from being diffused to other elements.

The first capping layer 22 may directly or indirectly contact a surface (e.g., a lower surface in FIG. 2) of the color filter layer CFL. The first capping layer 22 may be made of an inorganic material. For example, the first capping layer 22 may include, but not limited to, silicon nitride, aluminum nitride, zirconium nitride, titanium nitride, hafnium nitride, tantalum nitride, silicon oxide, aluminum oxide, titanium oxide, tin oxide, silicon oxynitride, or a combination thereof.

A partition layer PTL may be disposed on the first capping layer 22. The partition layer PTL may be located in the non-emission area NEM. The partition layer PTL may overlap or face the light blocking member BM. The partition layer PTL may include openings that expose the color filter layer CFL. The partition layer PTL may include a photosensitive organic material. However, embodiments may not be limited thereto, and the partition layer PTL may include a light blocking material.

The wavelength conversion layer WCL and/or the light transmitting layer TPL may be disposed in spaces exposed by the openings of the partition layer PTL. The wavelength conversion layer WCL and the light transmitting layer TPL may be formed by an inkjet process using the partition layer PTL as banks, but embodiments may not be limited thereto.

In an embodiment in which the light emitting layer EML of each pixel PX emits light of the third color, the wavelength conversion layer WCL may include a first wavelength conversion pattern WCL1 disposed in the first color pixel PX and a second wavelength conversion pattern WCL2 disposed in the second color pixel PX. The light transmitting layer TPL may be disposed in the third color pixel PX.

The first wavelength conversion pattern WCL1 may include a first base resin BRS1 and a first wavelength conversion material WCP1 disposed in the first base resin BRS1. The second wavelength conversion pattern WCL2 may include a second base resin BRS2 and a second wavelength conversion material WCP2 disposed in the second base resin BRS2. The light transmitting layer TPL may include a third base BRS3 and scatterers SCP disposed in the third base resin BRS3.

The first through third base resins BRS1 through BRS3 may include a light transmitting organic material. For example, the first through third base resins BRS1 through BRS3 may include, but not limited to, epoxy resin, acrylic resin, cardo resin, imide resin, or a combination thereof. The first through third base resins BRS1 through BRS3 may be made of the same material, but embodiments may not be limited thereto.

The scatterers SCP may be metal oxide particles or organic particles. The metal oxide may be, for example, titanium oxide ($TiO_2$), zirconium oxide ($ZrO_2$), aluminum oxide ($Al_2O_3$), indium oxide ($In_2O_3$), zinc oxide ($ZnO$), or tin oxide ($SnO_2$). The organic particles may be made of acrylic resin or urethane resin.

The first wavelength conversion material WCP1 may be a material that converts the third color into the first color, and the second wavelength conversion material WCP2 may be a material that converts the third color into the second color. The first wavelength conversion material WCP1 and the second wavelength conversion material WCP2 may be quantum dots, quantum rods, or phosphors. Examples of the quantum dots may include, but not limited to, group IV nanocrystals, group II-VI compound nanocrystals, group III-V compound nanocrystals, group IV-VI nanocrystals, and/or combinations of the same. Each of the first wavelength conversion pattern WCL1 and the second wavelength conversion pattern WCL2 may include scatterers SCP to increase wavelength conversion efficiency.

The light transmitting layer TPL disposed in the third color pixel PX may transmit light of the third color which may be incident from the light emitting layer EML while maintaining the wavelength of the light. The scatterers SCP of the light transmitting layer TPL may adjust an emission path of light emitted through the light transmitting layer TPL. The light transmitting layer TPL may not include a wavelength conversion material.

A second capping layer 23 may be disposed on the wavelength conversion layer WCL and the light transmitting layer TPL. The second capping layer 23 may be made of an inorganic material. The second capping layer 23 may include a material selected from the materials listed as example materials of the first capping layer 22. The second capping layer 23 and the first capping layer 22 may be made of the same material, but embodiments may not be limited thereto.

The filling layer 30 may be disposed between the first display substrate 10 and the second display substrate 20. The filling layer 30 may fill the space between the first display substrate 10 and the second display substrate 20 and bond the first display substrate 10 and the second display substrate 20 together. The filling layer 30 may be disposed between the thin-film encapsulation layer ENC of the first display substrate 10 and the second capping layer 23 of the second display substrate 20. The filling layer 30 may be made of, but not limited to, a Si-based organic material or an epoxy-based organic material.

A discussion of the circuit layer CCL of the display device 1 follows below.

Figure 3:
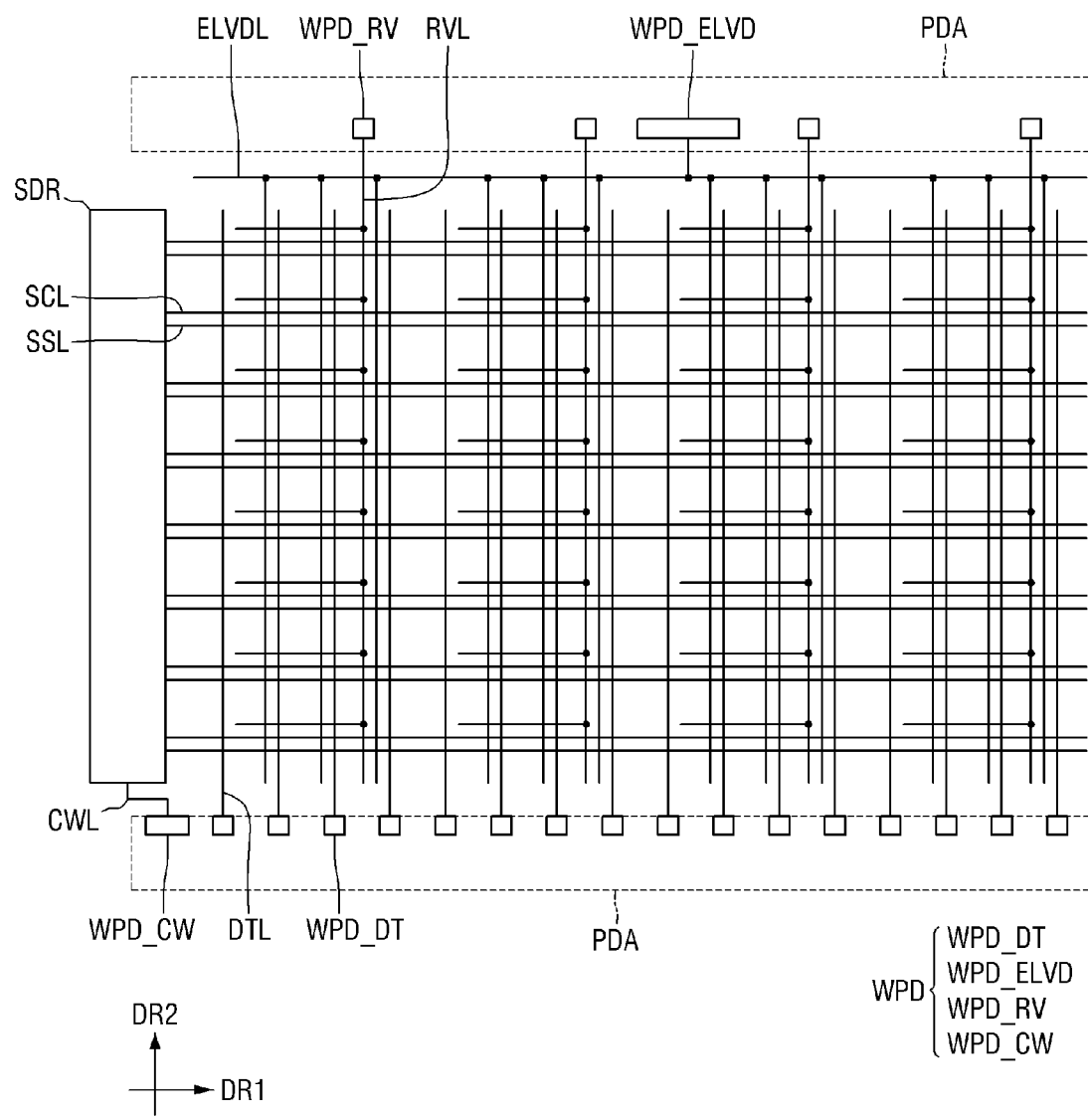
FIG. 3 shows a schematic layout view of a circuit layer of a first display substrate of the display device according to the embodiment.

FIG. 3 shows a schematic layout view of the circuit layer CCL of the first display substrate 10 of the display device 1 according to the embodiment.

Referring to FIG. 3, wirings may be disposed on the first substrate 1010. The wirings may include scan lines SCL, sensing lines SSL, data lines DTL, reference voltage lines RVL, and a first power line ELVDL. Although not illustrated, the wirings may include a second power line.

The scan lines SCL and the sensing lines SSL may extend in a first direction DR1. The scan lines SCL and the sensing lines SSL may be connected to the scan driver SDR. The scan driver SDR may include a driving circuit having the circuit layer CCL. The scan driver SDR may be disposed on the first substrate 1010 in the third non-display area NDA3. However, embodiments may not be limited thereto, and the scan driver SDR may also be disposed in a fourth non-display area located opposite the third non-display area NDA3 or may be disposed in both the third non-display area NDA3 and the fourth non-display area. The scan driver SDR may be connected to a signal connection wiring CWL, and at least one end of the signal connection wiring CWL may form a pad WPD_CW in the first non-display area NDA1 and/or the second non-display area NDA2 and thus may be connected to an external device EXD (see FIG. 1).

The data lines DTL and the reference voltage lines RVL may extend in a second direction DR2 intersecting the first direction DR1. The first power line ELVDL may include portions extending in the second direction DR2. The first power line ELVDL may include a portion extending in the first direction DR1. The first power line ELVDL may have a mesh structure. Although not shown, the second power line, like the first power line ELVDL, may include portions extending in the second direction DR2 and a portion extending in the first direction DR1.

A wiring pad WPD may be disposed at at least one end of each of the data lines DTL, the reference voltage lines RVL, and the first power line ELVDL. Each wiring pad WPD may be disposed in the non-display area NDA. Wiring pads WPD_DT (hereinafter referred to as 'data pads') of the data lines DTL may be disposed in the first non-display area NDA1, and wiring pads WPD_RV (hereinafter, referred to as 'reference voltage pads') of the reference voltage lines RVL and a wiring pad WPD_ELVD (hereinafter, referred to as a 'first power pad') of the first power line ELVDL may be disposed in the second non-display area NDA2. In another example, the data pads WPD_DT, the reference voltage pads WPD_RV, and the first power pad WPD_ELVD may all be disposed in the same area, for example, in the first non-display area NDA1. The external devices EXD (see FIG. 1) may be mounted on the wiring pads WPD. The external devices EXD may be mounted on the wiring pads WPD through an anisotropic conductive film, ultrasonic bonding, or the like.

Each pixel PX on the first substrate 1010 may include a pixel driving circuit. The above-described wirings may pass through each pixel PX or around each pixel PX to transmit a driving signal to each pixel driving circuit. The pixel driving circuit may include a transistor and a capacitor. The number of transistors and capacitors included in each pixel driving circuit may be changed variously. The pixel driving circuit herein may be a 3T1C type in which the pixel driving circuit includes three transistors and one capacitor. However, embodiments may not be limited thereto, and various other pixel structures such as a 2T1C structure, a 7T1C structure, and a 6T1C structure may also be applicable.

Figure 4:
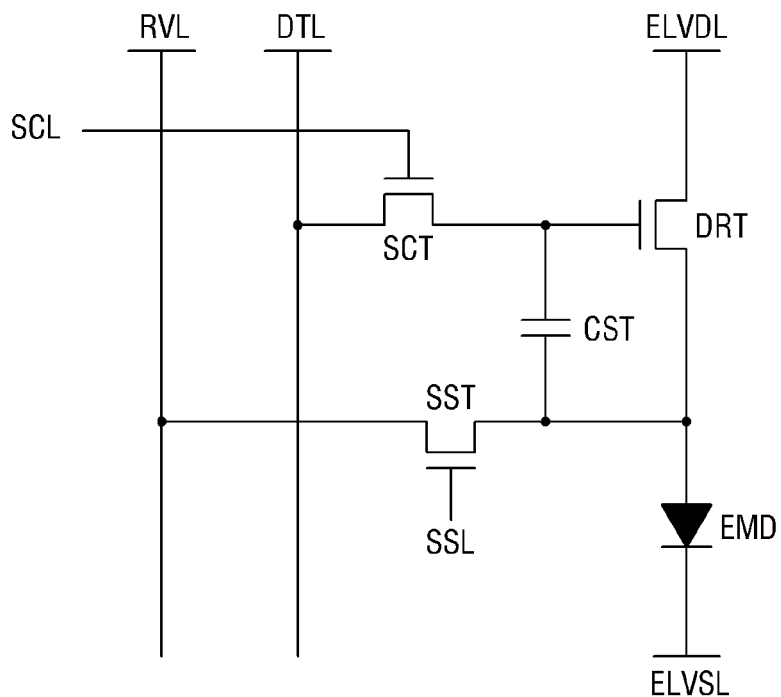
FIG. 4 shows a schematic diagram of an equivalent circuit of a pixel of the display device according to the embodiment.

FIG. 4 shows a schematic diagram of an equivalent circuit of a pixel PX of the display device 1 according to the embodiment.

Referring to FIG. 4, each pixel PX of the display device 1 according to the embodiment may include three transistors DRT, SCT and SST and one storage capacitor CST in addition to a light emitting element EMD.

The light emitting element EMD may emit light according to a current supplied through a driving transistor DRT. The light emitting element EMD may be implemented as an organic LED, a micro LED, or a nano LED.

A first electrode (e.g., an anode) of the light emitting element EMD may be connected to a source electrode of the driving transistor DRT, and a second electrode (e.g., a cathode) of the light emitting element EMD may be connected to the second power line to which a low-potential voltage (e.g., a second power supply voltage ELVS) that may be lower than a high-potential voltage (e.g. a first power supply voltage ELVD) of the first power line ELVDL may be supplied.

The driving transistor DRT may adjust a current flowing from the first power line ELVDL, to which the first power supply voltage ELVD may be supplied, to the light emitting element EMD according to a voltage difference between a gate electrode and the source electrode. The driving transistor DRT may include the gate electrode connected to a first source/drain electrode of a first switching transistor SCT, the source electrode connected to the first electrode of the light emitting element EMD, and a drain electrode connected to the first power line ELVDL to which the first power supply voltage ELVD may be applied.

The first switching transistor SCT may be turned on by a scan signal of a scan line SCL and may connect a data line DTL to the gate electrode of the driving transistor DRT. The first switching transistor SCT may include a gate electrode connected to the scan line SCL, the first source/drain electrode connected to the gate electrode of the driving transistor DRT, and a second source/drain electrode connected to the data line DTL.

A second switching transistor SST may be turned on by a sensing signal of a sensing line SSL and may connect a reference voltage line RVL to the source electrode of the driving transistor DRT. The second switching transistor SST may have a gate electrode connected to the sensing line SSL, a first source/drain electrode connected to the reference voltage line RVL, and a second source/drain electrode connected to the source electrode of the driving transistor DRT.

The first source/drain electrode of each of the first and second switching transistors SCT and SST may be a source electrode, and the second source/drain electrode may be a drain electrode, or vice versa.

The storage capacitor CST may be formed between the gate electrode and the source electrode of the driving transistor DRT. The storage capacitor CST may store a difference between a gate voltage and a source voltage of the driving transistor DRT.

The driving transistor DRT and the first and second switching transistors SCT and SST may be formed as thin-film transistors. The driving transistor DRT and the first and second switching transistors SCT and SST may be formed as N-type metal oxide semiconductor field effect transistors (MOSFETs), but the embodiments may not be limited thereto. In other embodiments, the driving transistor DRT and the first and second switching transistors SCT and SST may be formed as P-type MOSFETs. Also in other embodiments, some of the driving transistor DRT and the first and second switching transistors SCT and SST may be formed as N-type MOSFETs, and the others may be formed as P-type MOSFETs.

A discussion of a configuration of a pixel of the display device 1 according to the embodiment follows below.

Figure 5:
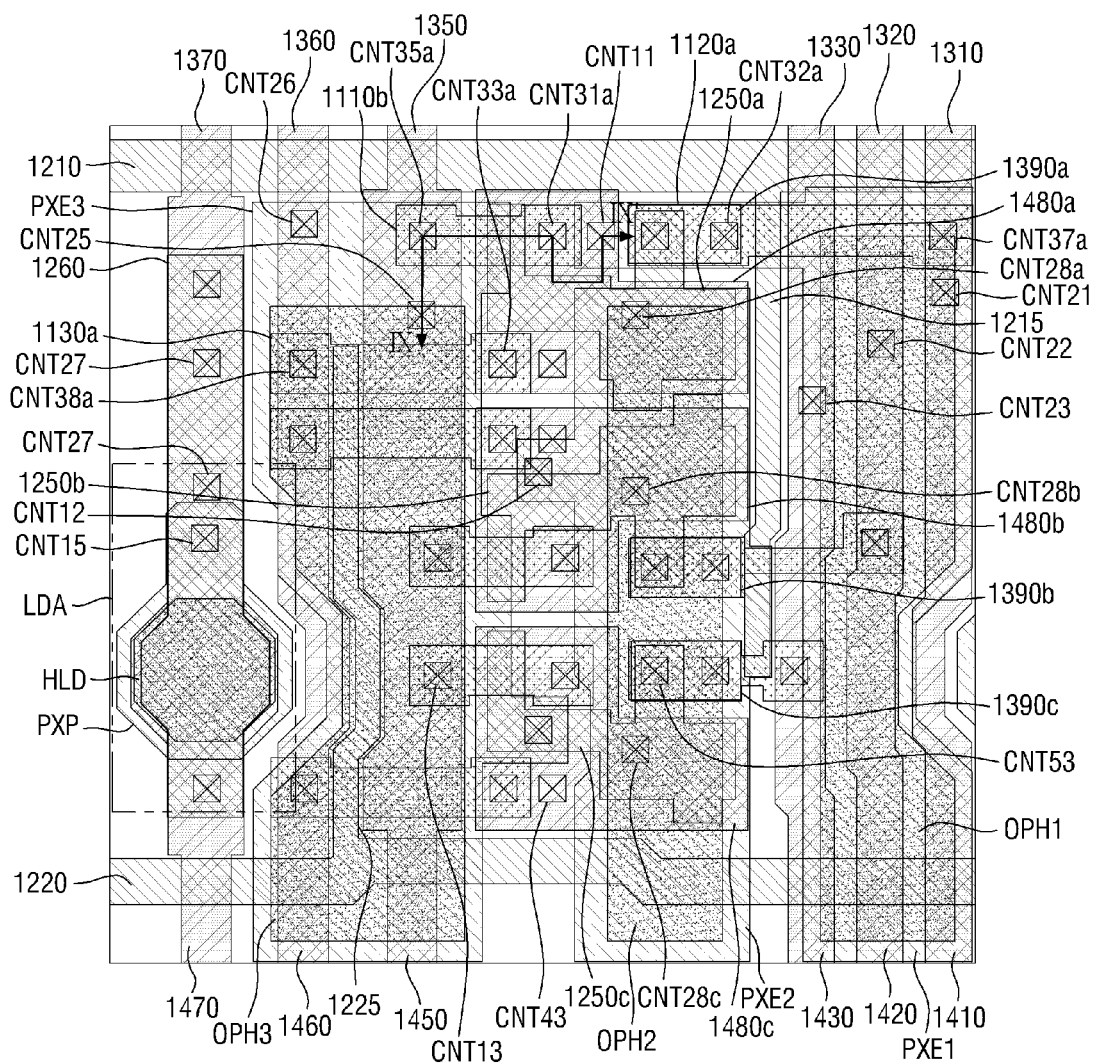
FIG. 5 shows a layout view of one pixel of the display device according to the embodiment.
Figure 6:
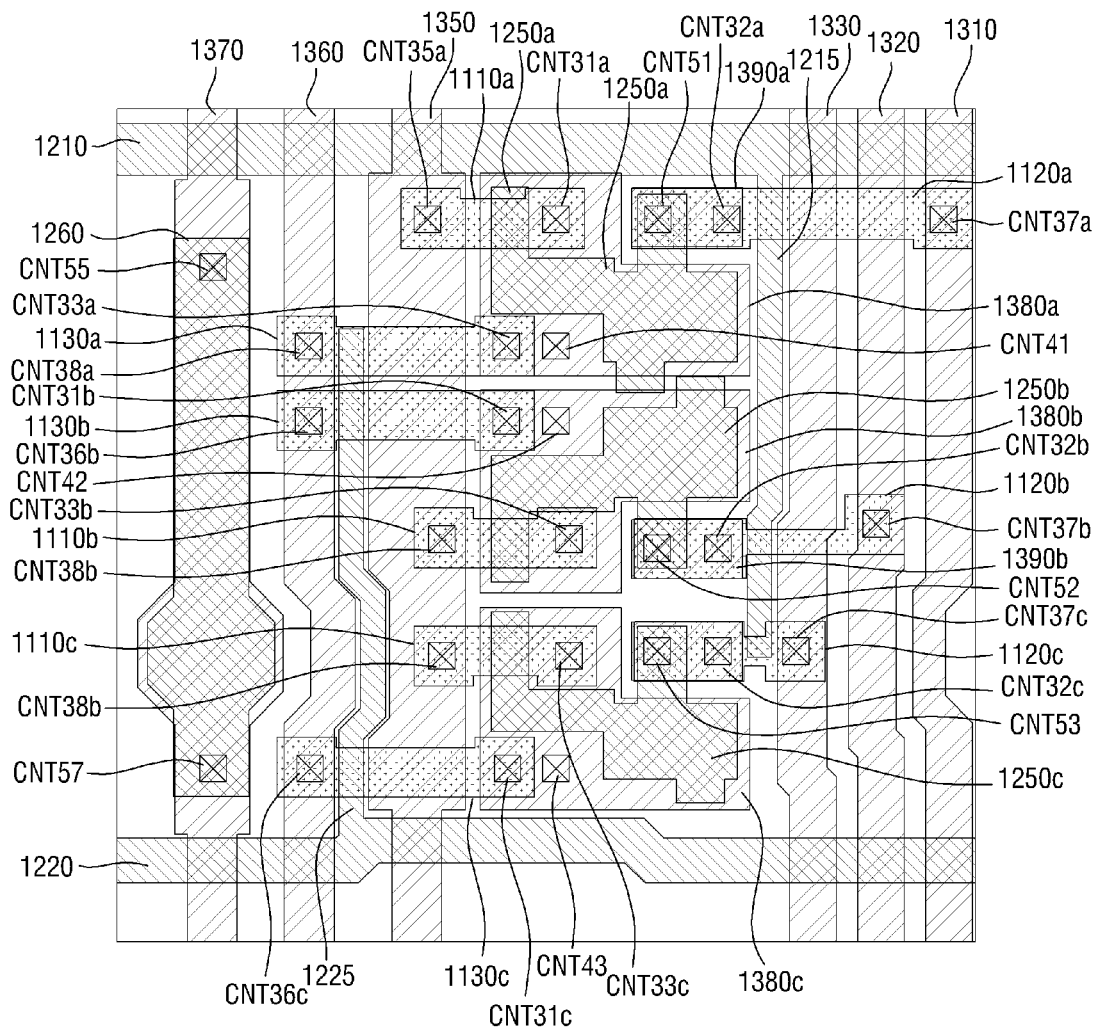
FIG. 6 shows a layout view of a semiconductor layer and some conductive layers included in the pixel of FIG. 5.
Figure 7:
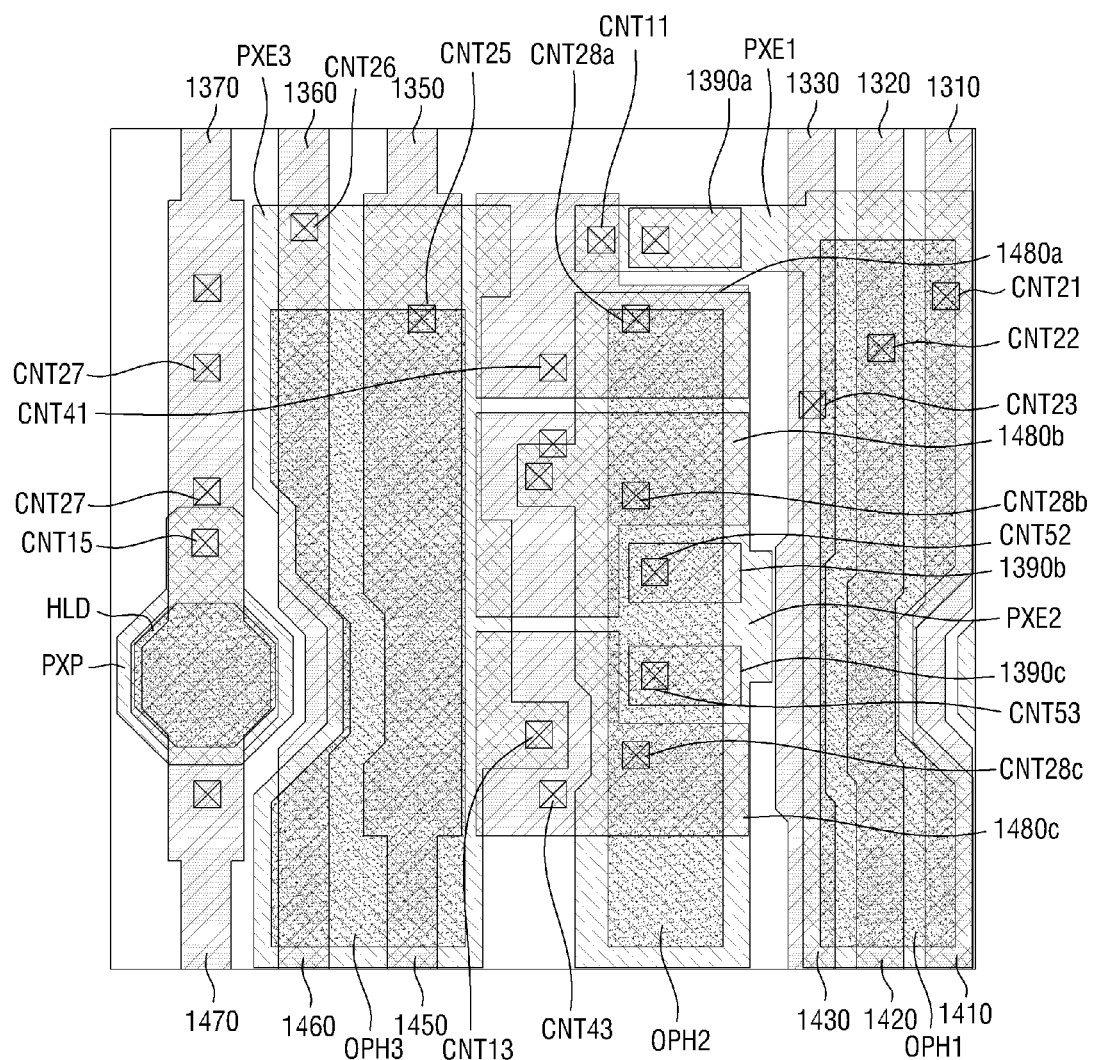
FIG. 7 shows a layout view of some conductive layers included in the pixel of FIG. 5.

FIG. 5 shows a layout view of a pixel PX of the display device 1 according to the embodiment. FIG. 6 shows a layout view of a semiconductor layer 1100 and some conductive layers included in the pixel PX of FIG. 5. FIG. 7 shows a layout view of some conductive layers included in the pixel PX of FIG. 5.

Referring to FIGS. 5 through 7, the display device 1 according to the embodiment may include the semiconductor layer 1100 and conductive layers 1200, 1300 and 1400. The display device 1 may include insulating layers 1020, 1030, 1050, 1060, 1070 and 1080 (see FIG. 8) disposed between the semiconductor layer 1100 and the conductive layers 1200, 1300 and 1400. The conductive layers 1200, 1300 and 1400 may include a gate conductive layer 1200, a first data conductive layer 1300, and a second data conductive layer 1400. The insulating layers 1020, 1030, 1050, 1060, 1070 and 1080 may include a buffer layer 1020, a gate insulating layer 1030, a first interlayer insulating layer 1050, a first protective layer 1060, a second protective layer 1070, and a planarization layer 1080.

FIG. 5 shows a layout view of the semiconductor layer 1100 and conductive layers stacked in one pixel PX of the display device 1 according to the embodiment. FIG. 6 shows a layout view of the semiconductor layer 1100, the gate conductive layer 1200, and the first data conductive layer 1300 as being stacked. FIG. 7 shows a layout view of the first data conductive layer 1300, the second data conductive layer 1400, the pixel electrodes PXE, and the pixel defining layer PDL as being stacked.

Each pixel PX of the display device 1 may include subpixels. An area of the pixel PX illustrated in FIGS. 5 through 7 may form a first subpixel, another area may form a second subpixel, and another area may form a third subpixel. Each subpixel may include transistors, a storage capacitor, and wirings as shown in the equivalent circuit described above with reference to FIG. 4. FIGS. 5 through 7 show three subpixels, each of which may include the driving transistor DRT, the first switching transistor SCT, the second switching transistor SST, and the storage capacitor CST. These subpixels may be connected to different data wirings but may be electrically connected to the same power wiring. Discussion of layers disposed in each pixel PX or subpixel of the display device 1 follows below in regard to layers disposed in a subpixel. Referring to FIGS. 5 and 6, the semiconductor layer 1100 may be disposed on the first substrate 1010. The buffer layer 1020 (see FIG. 8) may be disposed on the first substrate 1010, and the semiconductor layer 1100 may be disposed on the buffer layer 1020. The semiconductor layer 1100 may include first semiconductor layers 1110, second semiconductor layers 1120, and third semiconductor layers 1130. The first semiconductor layers 1110 may be active layers of the driving transistors DRT included in one pixel PX, the second semiconductor layers 1120 may be active layers of the first switching transistors SCT, and the third semiconductor layers 1130 may be active layers of the second switching transistors SST.

The first semiconductor layers 1110, the second semiconductor layers 1120 and the third semiconductor layers 1130 may extend in the first direction DR1, that is, in the horizontal direction, and both ends of each of the first semiconductor layers 1110, the second semiconductor layers 1120 and the third semiconductor layers 1130 may be expanded to have an increased width relative to remaining portions thereof. A portion of each of the first semiconductor layers 1110, the second semiconductor layers 1120 and the third semiconductor layers 1130 which extends in the first direction DR1 may overlap a gate conductive layer 1200 to form a gate electrode of each transistor, and both expanded ends of each of the layers may contact a first data conductive layer 1300 to form a source electrode and a drain electrode of each transistor. Both ends of the semiconductor layer 1100 may be partially conductive to form conductive regions (see FIG. 8), and a channel region (see FIG. 8) may be formed between the conductive regions.

The first semiconductor layers 1110 may include an eleventh semiconductor layer 1110a located above a center of the pixel PX and a twelfth semiconductor layer 1110b and a thirteenth semiconductor layer 1110c located adjacent to the center of the pixel PX. The eleventh semiconductor layer 1110a may be an active layer of the driving transistor DRT of the first subpixel, the twelfth semiconductor layer 110b may be an active layer of the driving transistor DRT of the second subpixel, and the thirteenth semiconductor layer 1110c may be an active layer of the driving transistor DRT of the third subpixel.

The first semiconductor layers 1110 may be patterned to extend in a same direction. For example, a first side of each of the first semiconductor layers 1110 may contact a portion of a first conductive pattern 1380 of the first data conductive layer 1300, a second side of each of the first semiconductor layers 1110 may contact a portion of a first voltage wiring 1350 of the first data conductive layer 1300, and a portion between the first side and the second side may overlap a portion of a gate conductive pattern 1250 of the gate conductive layer 1200. The first data conductive layer 1300 which contacts the first side of each of the first semiconductor layers 1110 may be a source electrode of the driving transistor DRT, and the first data conductive layer 1300 which contacts the second side of each of the first semiconductor layers 1110 may be a drain electrode of the driving transistor DRT. The gate conductive layer 1200 overlapping or facing the portion between the first side and the second side of each of the first semiconductor layers 1110 may be a gate electrode of the driving transistor DRT.

The second semiconductor layers 1120 may be disposed on a right side of the center of the pixel PX. The second semiconductor layers 1120 may include a twenty-first semiconductor layer 1120a, a twenty-second semiconductor layer 1120b, and a twenty-third semiconductor layer 1120c. The twenty-first semiconductor layer 1120a may be an active layer of the first switching transistor SCT of the first subpixel, the twenty-second semiconductor layer 1120b may be an active layer of the first switching transistor SCT of the second subpixel, and the twenty-third semiconductor layer 1120c may be an active layer of the first switching transistor SCT of the third subpixel.

The second semiconductor layers 1120 may be patterned to extend in a same direction. A first side of each of the second semiconductor layers 1120 may contact a portion of a second conductive pattern 1390 of the first data conductive layer 1300, and a second side of each of the second semiconductor layers 1120 may contact one of first data signal lines 1310, 1320 and 1330 of the first data conductive layer 1300. A portion between the first side and the second side of each of the second semiconductor layers 1120 may overlap or face a portion of a scan signal line 1210 of the gate conductive layer 1200. The first data conductive layer 1300 which contacts the first side of each of the second semiconductor layers 1120 may be a source electrode of the first switching transistor SCT, and the first data conductive layer 1300 which contacts the second side may be a drain electrode of the first switching transistor SCT. The gate conductive layer 1200 overlapping or facing the portion between the first side and the second side of each of the second semiconductor layers 1120 may be a gate electrode of the first switching transistor SCT.

The second sides of the second semiconductor layers 1120 may contact different first data signal lines 1310, 1320 and 1330. The twenty-first semiconductor layer 1120a may contact an eleventh data signal line 1310, the twenty-second semiconductor layer 1120b may contact a twelfth data signal line 1320, and the twenty-third semiconductor layer 1120c may contact a thirteenth data signal line 1330. Since the second semiconductor layers 1120 may contact different first data signal lines 1310, 1320 and 1330, different data signals may be transmitted to different subpixels.

The third semiconductor layers 1130 may be located adjacent to a left side of the center of the pixel PX. The third semiconductor layers 1130 may include a thirty-first semiconductor layer 1130a, a thirty-second semiconductor layer 1130b, and a thirty-third semiconductor layer 1130c. The thirty-first semiconductor layer 1130a may be an active layer of the second switching transistor SST of the first subpixel, the thirty-second semiconductor layer 1130b may be an active layer of the second switching transistor SST of the second subpixel, and the thirty-third semiconductor layer 1130c may be an active layer of the second switching transistor SST of the third subpixel.

The third semiconductor layers 1130 may be patterned to extend in a same direction. A first side of each of the third semiconductor layers 1130 may contact a first conductive pattern 1380 of the first data conductive layer 1300, and a second side of each of the third semiconductor layers 1130 may contact a first reference voltage wiring 1360 of the first data conductive layer 1300. A portion between the first side and the second side of each of the third semiconductor layers 1130 may overlap or face a portion of a sensing signal line 1220 of the gate conductive layer 1200. The first data conductive layer 1300 which contacts the first side of each of the third semiconductor layers 1130 may be a source electrode of the second switching transistor SST, and the first data conductive layer 1300 which contacts the second side may be a drain electrode of the second switching transistor SST. The gate conductive layer 1200 overlapping or facing the portion between the first side and the second side of each of the third semiconductor layers 1130 may be a gate electrode of the second switching transistor SST.

The semiconductor layer 1100 may include an oxide semiconductor. For example, the oxide semiconductor of the semiconductor layer 1100 may be indium-tin oxide (ITO), indium-tin-gallium oxide (ITGO), indium-gallium-zinc oxide (IGZO), or indium-gallium-zinc-tin oxide (IGZTO).

The gate insulating layer 1030 (see FIG. 8) may be disposed on the semiconductor layer 1100. A discussion thereof follows below with reference to FIG. 8.

The gate conductive layer 1200 may be disposed on the gate insulating layer 1030 or the buffer layer 1020. The gate conductive layer 1200 may include the scan signal line 1210, the sensing signal line 1220, and gate conductive patterns 1250, and a gate pattern portion 1260. The scan signal line 1210 may transmit a scan signal to the first switching transistor SCT of each pixel PX or subpixel, and the sensing signal line 1220 may transmit a sensing signal to the second switching transistor SCT of each pixel PX or subpixel. For example, the scan signal line 1210 may be the scan line SCL of FIG. 4, and the sensing signal line 1220 may be the sensing line SSL of FIG. 4. The gate conductive patterns 1250 may overlap or face the first semiconductor layers 1110 to form the gate electrodes of the driving transistors DRT. The gate pattern portion 1260 may overlap or face a second voltage wiring 1370 of the first data conductive layer 1300.

The scan signal line 1210 may extend in the first direction DR1 and include a first extension portion 1215 branching from the scan signal line 1210 and extending in the second direction DR2. The scan signal line 1210 may extend in the first direction DR1 on an upper side of the pixel PX. The scan signal line 1210 may extend to another pixel PX neighboring the pixel PX in the first direction DR. The first extension portion 1215 may be located in a portion of the scan signal line 1210, for example, on the right side of the center of the pixel PX, and may extend in the second direction DR2 within the pixel PX.

The first extension portion 1215 of the scan signal line 1210 may overlap or face a portion of each of the second semiconductor layers 1120. The first extension portion 1215 may form the gate electrode of the first switching transistor SCT in each pixel PX or subpixel. The first switching transistor SCT may receive a scan signal from the scan signal line 1210 through the first extension portion 1215.

The sensing signal line 1220 may extend in the first direction DR1 and include a second extension portion 1225 branching from the sensing signal line 1220 and extending in the second direction DR2. The sensing signal line 1220 may extend in the first direction DR1 on a lower side of the pixel PX. The sensing signal line 1220 may extend to another pixel PX neighboring the pixel PX in the first direction DR1. The second extension portion 1225 may be located in a portion of the sensing signal line 1220, for example, on the left side of the center of the pixel PX, and may extend in the second direction DR2 within the pixel PX.

The second extension portion 1225 of the sensing signal line 1220 may overlap or face a portion of each of the third semiconductor layers 1130. The second extension portion 1225 may form the gate electrode of the second switching transistor SST in each pixel PX or subpixel. The second switching transistor SST may receive a sensing signal from the sensing signal line 1220 through the second extension portion 1225.

The gate conductive patterns 1250 may be disposed between the first extension portion 1215 of the scan signal line 1210 and the second extension portion 1225 of the sensing signal line 1220. The gate conductive patterns 1250 may include a first gate conductive pattern 1250*a*, a second gate conductive pattern 1250*b*, and a third gate conductive pattern 1250*c*. The first gate conductive pattern 1250*a*, the second gate conductive pattern 1250*b*, and the third gate conductive pattern 1250*c* may partially overlap or face the first semiconductor layers 1110, respectively. The first gate conductive pattern 1250*a* may overlap or face a portion of the eleventh semiconductor layer 1110*a* to form the gate electrode of the driving transistor DRT of the first subpixel. The first gate conductive pattern 1250*a* may overlap or face at least a channel region of the eleventh semiconductor layer 1110*a*. Likewise, the second gate conductive pattern 1250*b* may overlap or face a portion of the twelfth semiconductor layer 1110*b* to form the gate electrode of the driving transistor DRT of the second subpixel, and the third gate conductive pattern 1250*c* may overlap or face a portion of the thirteenth semiconductor layer 1110*c* to form the gate electrode of the driving transistor DRT of the third subpixel.

The gate conductive patterns 1250 may overlap or contact first conductive patterns 1380 and second conductive patterns 1390 of the first data conductive layer 1300. Each of the gate conductive patterns 1250 may overlap or contact a first conductive pattern 1380 to form a first electrode of the storage capacitor CST of each pixel PX or subpixel. The gate conductive patterns 1250 may contact the first conductive patterns 1380, and thus be electrically connected to the second switching transistors SST, and may contact the second conductive patterns 1390, and thus be electrically connected to the first switching transistors SCT.

For example, the first gate conductive pattern 1250*a* may overlap or contact an eleventh conductive pattern 1380*a* to form the second electrode of the storage capacitor CST of the first subpixel. The first gate conductive pattern 1250*a* may contact the eleventh conductive pattern 1380*a*, and thus be electrically connected to the source electrode of the second switching transistor SST of the first subpixel, and may contact a twenty-first conductive pattern 1390*a*, and thus be electrically connected to the source electrode of the first switching transistor SCT of the first subpixel. Likewise, the second gate conductive pattern 1250*b* may partially overlap or contact a twelfth conductive pattern 1380*b* and a twenty-second conductive pattern 1390*b*, and the third gate conductive pattern 1250*c* may partially contact a thirteenth conductive pattern 1380*c* and a twenty-third conductive pattern 1390*c*.

The gate pattern portion 1260 may include an extension portion extending in the second direction DR2 and an expanded portion having an increased width relative to remaining portions thereof. The gate pattern portion 1260 may be disposed on the left side (see, e.g., FIG. 5) and may be disposed between the scan signal line 1210 and the sensing signal line 1220 extending in the first direction DR1. The gate pattern portion 1260 may be electrically connected to the second voltage wiring 1370 and may reduce wiring resistance of the second voltage wiring 1370.

The gate conductive layer 1200 may include one or more metals selected from, but not limited to, molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and/or a combination thereof. The gate conductive layer 1200 may include a single layer or multiple layers.

The first interlayer insulating layer 1050 (see FIG. 8) may be disposed on the gate conductive layer 1200. A discussion thereof follows below with reference to FIG. 8.

The first data conductive layer 1300 may be disposed on the first interlayer insulating layer 1050. The first data conductive layer 1300 may include first data signal lines 1310, 1320 and 1330, the first voltage wiring 1350, the first reference voltage wiring 1360, the second voltage wiring 1370, first conductive patterns 1380, and second conductive patterns 1390.

The first data signal lines 1310, 1320 and 1330 may each transmit a data signal to each pixel PX or subpixel. For example, each of the first data signal lines 1310, 1320 and 1330 may be the data line DTL of FIG. 4. The first data signal lines 1310, 1320 and 1330 may be disposed on a side, e.g., the right side of the center of the pixel PX in the first direction DR1, and may extend in the second direction DR2. The first data signal lines 1310, 1320 and 1330 may extend to another pixel PX neighboring the pixel PX in the second direction DR2.

The first data signal lines 1310, 1320 and 1330 may include the eleventh data signal line 1310, the twelfth data signal line 1320, and the thirteenth data signal line 1330. The eleventh data signal line 1310 may contact a second side of the twenty-first semiconductor layer 1120a to transmit a data signal to the first switching transistor SCT of the first subpixel. The twelfth data signal line 1320 may contact a second side of the twenty-second semiconductor layer 1120b to transmit a data signal to the first switching transistor SCT of the second subpixel.

The thirteenth data signal line 1330 may contact a second side of the twenty-third semiconductor layer 1120c to transmit a data signal to the first switching transistor SCT of the third subpixel.

As described below with reference to FIG. 8, the first interlayer insulating layer 1050 on which the first data conductive layer 1300 may be disposed may include contact holes. The contact holes may penetrate the first interlayer insulating layer 1050 and/or the gate insulating layer 1030 and the buffer layer 1020 to expose the semiconductor layer 1100.

The first interlayer insulating layer 1050 may include thirty-seventh contact holes CNT37 which may penetrate the first interlayer insulating layer 1050 and the gate insulating layer 1030 to expose portions of the second semiconductor layers 1120. The first data signal lines 1310, 1320 and 1330 may contact the second sides of the second semiconductor layers 1120 through the thirty-seventh contact holes CNT37, respectively. For example, the eleventh data signal line 1310 may contact the second side of the twenty-first semiconductor layer 1120a through a (37-1)$^{th}$ contact hole CNT37a. Likewise, the twelfth data signal line 1320 and the thirteenth data signal line 1330 may contact the second sides of the twenty-second semiconductor layer 1120b and the twenty-third semiconductor layer 1120c through a (37-2)$^{th}$ contact hole CNT37b and a (37-3)$^{th}$ contact hole CNT37c, respectively.

The first voltage wiring 1350 may transmit the first power supply voltage ELVD to each pixel PX or subpixel. For example, the first voltage wiring 1350 may be the first power line ELVDL of FIG. 4. The first voltage wiring 1350 may be disposed on a side, e.g., the left side of the center of the pixel PX in the first direction DR1, and may extend in the second direction DR2. The first voltage wiring 1350 may extend to another pixel PX neighboring the pixel PX in the second direction DR2. The first voltage wiring 1350 may contact the second sides of the first semiconductor layers 1110 to apply the first power supply voltage ELVD to the driving transistor DRT of each subpixel.

The first interlayer insulating layer 1050 may include thirty-fifth contact holes CNT35 which may expose portions of the first semiconductor layers 1110. The first voltage wiring 1350 may contact the second sides of the first semiconductor layers 1110 through the thirty-fifth contact holes CNT35, respectively. For example, the first voltage wiring 1350 may contact a second side of the eleventh semiconductor layer 1110a through a (35-1)$^{th}$ contact hole CNT35a. Likewise, the first voltage wiring 1350 may contact second sides of the twelfth semiconductor layer 1110b and the thirteenth semiconductor layer 1110c through a (35-2)$^{th}$ contact hole CNT35b and a (35-3)$^{th}$ contact hole CNT35c, respectively.

The first reference voltage wiring 1360 may apply a reference voltage RV to each pixel PX or subpixel. For example, the first reference voltage wiring 1360 may be the reference voltage line RVL of FIG. 4. The first reference voltage wiring 1360 may be disposed on aside, e.g., a left side of the first voltage wiring 1350 in the first direction DR1, and may extend in the second direction DR2. The first reference voltage wiring 1360 may extend to another pixel PX neighboring the pixel PX in the second direction DR2. The first reference voltage wiring 1360 may contact the second sides of the third semiconductor layers 1130 to apply the reference voltage RV to the second switching transistor SST of each subpixel.

The first interlayer insulating layer 1050 may include thirty-sixth contact holes CNT36 which may expose portions of the third semiconductor layers 1130. The first reference voltage wiring 1360 may contact the second sides of the third semiconductor layers 1130 through the thirty-sixth contact holes CNT36, respectively. For example, the first reference voltage wiring 1360 may contact a second side of the thirty-first semiconductor layer 1130a through a (36-1)$^{th}$ contact hole CNT36a. Likewise, the first reference voltage wiring 1360 may contact second sides of the thirty-second semiconductor layer 1130b and the thirty-third semiconductor layer 1130c through a (36-2)$^{th}$ contact hole CNT36b and a (36-3)$^{th}$ contact hole CNT36c, respectively.

The second voltage wiring 1370 may apply the second power supply voltage ELVS to each pixel PX or subpixel. For example, the second voltage wiring 1370 may be the second power line ELVSL of FIG. 4. The second voltage wiring 1370 may be disposed on aside, e.g., a left side of the reference voltage wiring 1360 in the first direction DR1 and may extend in the second direction DR2. The second voltage wiring 1370 may extend to another pixel PX neighboring the pixel PX in the second direction DR2.

Although not shown, the second power supply voltage ELVS may be applied to an electrode of the light emitting element EMD, for example, the common electrode CME, which may be a cathode of the light emitting element EMD. The common electrode CME may be connected to the second power line ELVSL through a power wiring located in the non-display area NDA and may receive the second power supply voltage ELVS as a result of the connection.

In a case that the display device 1 may have high resolution due to the inclusion of a large number of pixels PX, the second power supply voltage ELVS applied to the common electrode CME, which contacts the power wiring only in the non-display area NDA, may drop depending on the position of a pixel PX in the display area DPA. Since the second power supply voltage ELVS, which may have a lower potential than the second power supply voltage ELVS that may be applied to a pixel PX adjacent to the non-display area NDA, may be applied to a pixel PX spaced apart from the non-display area NDA, the intensity of light emitted from the light emitting element EMD of each pixel PX may not be uniform. In the display device 1 according to the embodiment, however, the second voltage wiring 1370 and a fourth voltage wiring 1470 located in at least a portion of the pixel PX may be electrically connected to the common electrode CME. Therefore, the second power supply voltage ELVS may be applied to each pixel PX with a uniform potential. The common electrode CME may be electrically connected to the second voltage wiring 1370 and the fourth voltage wiring 1470 by contacting some conductive layers in an opening area LDA (see FIG. 5) of each pixel PX. According to an embodiment, the second voltage wiring 1370 may include a first extension portion SP extending in the second direction DR2 and a first expanded portion EP1 located in the opening area LDA and having a wider width than the first extension portion SP1 (see FIG. 9). A hole HLD (see FIG. 10) of the pixel defining layer PDL disposed above the first data conductive layer 1300 may be located in the first expanded portion EP1, and the common electrode CME may contact another conductive layer through the hole HLD. The conductive layer contacting the common electrode CME may contact the second voltage wiring 1370 and the fourth voltage wiring 1470 through a contact hole located in the planarization layer 1080, and thus the common electrode CME may be electrically connected to the second voltage wiring 1370 and the fourth voltage wiring 1470.

Since conductive layers and insulating layers may be disposed between the common electrode CME and the second voltage wiring 1370, if the common electrode CME and the second voltage wiring 1370 are connected to each other at a position where they overlap each other, a size of a contact hole or the hole HLD for exposing a conductive layer disposed under the common electrode CME may need to be increased. However, a width for a contact hole in each pixel PX of a high-resolution display device 1 may be limited. Therefore, it may be difficult to secure a space within the pixel PX in which the contact hole may be disposed to enable connection of the common electrode CME and the second voltage wiring 1370. In the display device 1 according to the embodiment, the hole HLD through which the common electrode CME and the conductive layer contact each other may be spaced apart from a contact hole through which the conductive layer and the second voltage wiring 1370 or the fourth voltage wiring 1470 contact each other. Thus, the widths of the hole HLD and the contact hole may be minimized since the hole HLD and the contact hole may not overlap or face each other in the thickness direction.

The second voltage wiring 1370 may contact the gate pattern portion 1260 through a fifty-fifth contact hole CNT55 and a fifty-seventh contact hole CNT57 which may penetrate the first interlayer insulating layer 1050 to expose portions of the gate pattern portion 1260.

The first conductive patterns 1380 and the second conductive patterns 1390 may be disposed between the first data signal lines 1310, 1320 and 1330 and the first voltage wiring 1350. The first conductive patterns 1380 and the second conductive patterns 1390 may overlap or face the first sides of the first semiconductor layers 1110, the second semiconductor layers 1120 and the third semiconductor layers 1130. The first conductive patterns 1380 may overlap or face the gate conductive patterns 1250. The first conductive patterns 1380 may contact the first sides of the first semiconductor layers 1110 and the third semiconductor layers 1130 through thirty-first contact holes CNT31 and thirty-third contact holes CNT33 formed in the first interlayer insulating layer 1050. The second conductive patterns 1390 may contact the first sides of the second semiconductor layers 1120 through thirty-second contact holes CNT32 formed in the first interlayer insulating layer 1050.

The first conductive patterns 1380 and the second conductive patterns 1390 may form the source electrodes of the driving transistor DRT and the second switching transistor SST of each subpixel, and each of the second conductive patterns 1390 may form the source electrode of the first switching transistor SCT of each subpixel. Each of the first conductive patterns 1380 may overlap or face a gate conductive pattern 1250 to form a second electrode of the storage capacitor CST of each subpixel.

The first conductive patterns 1380 may include the eleventh conductive pattern 1380a, the twelfth conductive pattern 1380b, and the thirteenth conductive pattern 1380c, and the second conductive patterns 1390 may include the twenty-first conductive pattern 1390a, the twenty-second conductive pattern 1390b, and the twenty-third conductive pattern 1390c.

The eleventh conductive pattern 1380a may contact a first side of the eleventh semiconductor layer 1110a through a $(31\text{-}1)^{th}$ contact hole CNT31a which may penetrate the first interlayer insulating layer 1050 and the gate insulating layer 1030 to expose the first side of the eleventh semiconductor layer 1110a. The eleventh conductive pattern 1380a may form the source electrode of the driving transistor DRT of the first subpixel. The eleventh conductive pattern 1380a may contact a first side of the thirty-first semiconductor layer 1130a through a $(33\text{-}1)^{th}$ contact hole CNT33a which may penetrate the first interlayer insulating layer 1050 and the gate insulating layer 1030 to expose the first side of the thirty-first semiconductor layer 1130a. The eleventh conductive pattern 1380a may be electrically connected to the second switching transistor SST of the first subpixel.

The twenty-first conductive pattern 1390a may contact a first side of the twenty-first semiconductor layer 1120a through a $(32\text{-}1)^{th}$ contact hole CNT32a which may penetrate the first interlayer insulating layer 1050 and the gate insulating layer 1030 to expose the first side of the twenty-first semiconductor layer 1120a. The twenty-first conductive pattern 1390a may form the source electrode of the first switching transistor SCT of the first subpixel.

The first conductive patterns 1380 may contact a conductive layer disposed on the first substrate 1010 through contact holes which may penetrate the first interlayer insulating layer 1050, the gate insulating layer 1030 and the buffer layer 1020 to expose the conductive layer. The eleventh conductive pattern 1380a may contact the conductive layer through a forty-first contact hole CNT41, the twelfth conductive pattern 1380b may contact the conductive layer through a forty-second contact hole CNT42, and the thirteenth conductive pattern 1380c may contact the conductive layer through a forty-third contact hole CNT43.

The display device 1 may include a light blocking layer BML (see FIG. 8) disposed between the first substrate 1010 and the buffer layer 1020. The first conductive patterns 1380 may contact the light blocking layer BML through the forty-first contact hole CNT41, the forty-second contact hole CNT42, and the forty-third contact hole CNT43.

The second conductive patterns 1390 may contact the conductive layer through contact holes which may penetrate the first interlayer insulating layer 1050 to expose portions of the gate conductive patterns 1250. The twenty-first conductive pattern 1390a may contact a gate conductive pattern 1250 through a fifty-first contact hole CNT51. The twenty-second conductive pattern 1390b may contact a gate conductive pattern 1250 through a fifty-second contact hole CNT52. The twenty-third conductive pattern 1390c may contact a gate conductive pattern 1250 through a fifty-third contact hole CNT53. The second conductive patterns 1390 may form the source electrodes of the first switching transistors SCT and connect the source electrodes of the first switching transistors SCT to the gate electrodes of the driving transistors DRT and the first electrodes of the storage capacitors CST.

The above description of the eleventh conductive pattern 1380a and the twenty-first conductive pattern 1390a may also be applicable to the description of the twelfth conductive pattern 1380b, the thirteenth conductive pattern 1380c, the twenty-second conductive pattern 1390b and the twenty-third conductive pattern 1390c disposed in other subpixels.

The first data conductive layer 1300 may include one or more metals selected from, but not limited to, molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu), and/or a combination thereof. The first data conductive layer 1300 may include a single layer or multiple layers. For example, the first data conductive layer 1300 may have a stacked structure of Ti/Al/T, Mo/Al/Mo, Mo/AlGe/Mo, Ti/Cu, or a combination thereof.

The first protective layer 1060 (see FIG. 8) may be disposed on the first data conductive layer 1300. The display device 1 may include the second data conductive layer 1400 in addition to the first data conductive layer 1300. The second data conductive layer 1400 may overlap or face the first data conductive layer 1300 and may have substantially the same shape as the first data conductive layer 1300. The first data conductive layer 1300 and the second data conductive layer 1400 may be electrically connected to each other. Wirings for transmitting power or data signals may be divided into different layers including, for example, the first data conductive layer 1300 and the second data conductive layer 1400. Thus, the space of the non-display area NDA where the wiring pads WPD and the wirings may be disposed may be minimized.

The second data conductive layer 1400 may include second data signal lines 1410, 1420 and 1430, a third voltage wiring 1450, a second reference voltage wiring 1460, the fourth voltage wiring 1470, and third conductive patterns 1480 so as to correspond to the first data conductive layer 1300. The second data signal lines 1410, 1420 and 1430 may overlap or face the first data signal lines 1310, 1320 and 1330, respectively. The third voltage wiring 1450 may overlap or face the first voltage wiring 1350. The second reference voltage wiring 1460 may overlap or face the first reference voltage wiring 1360. The fourth voltage wiring 1470 may overlap or face the second voltage wiring 1370. Thus, the fourth voltage wiring 1470 may include a second extension portion SP2 extending in a direction and a second expanded portion EP2 having a wide width. The positional relationships and shapes of the above elements may be substantially the same as those of the elements of the first data conductive layer 1300.

The second data signal lines 1410, 1420 and 1430 may contact the first data signal lines 1310, 1320 and 1330 through contact holes which may penetrate the first protective layer 1060 to expose portions of the first data signal lines 1310, 1320 and 1330. A twenty-first data signal line 1410 may contact the eleventh data signal line 1310 through a twenty-first contact hole CNT21. A twenty-second data signal line 1420 may contact the twelfth data signal line 1320 through a twenty-second contact hole CNT22, and a twenty-third data signal line 1430 may contact the thirteenth data signal line 1330 through a twenty-third contact hole CNT23.

The third voltage wiring 1450 may contact the first voltage wiring 1350 through a twenty-fifth contact hole CNT25 which may expose a portion of the first voltage wiring 1350. The second reference voltage wiring 1460 may contact the first reference voltage wiring 1360 through a twenty-sixth contact hole CNT26, and the fourth voltage wiring 1470 may contact the second voltage wiring 1370 through a twenty-seventh contact hole CNT27.

The third conductive patterns 1480 may contact the first conductive patterns 1380 through twenty-eighth contact holes CNT28 which may penetrate the first protective layer 1060 to expose portions of the first conductive patterns 1380. A thirty-first conductive pattern 1480a may contact the eleventh conductive pattern 1380a through a $(28\text{-}1)^{th}$ contact hole CNT28a. A thirty-second conductive pattern 1480b may contact the twelfth conductive pattern 1380b through a $(28\text{-}2)^{th}$ contact hole CNT28b, and a thirty-third conductive pattern 1480c may contact the thirteenth conductive pattern 1380c through a $(28\text{-}3)^{th}$ contact hole CNT28c.

The second data conductive layer 1400 may include substantially the same material as the first data conductive layer 1300.

The second protective layer 1070 and the planarization layer 1080 (see FIG. 8) may be disposed on the second data conductive layer 1400.

A pixel electrode layer may be disposed on the planarization layer 1080. The pixel electrode layer may include a pixel electrode PXE which may be an anode of the light emitting element EMD of each subpixel and an electrode pattern PXP which may be located in the opening area LDA.

The pixel electrodes PXE may include a first pixel electrode PXE1, a second pixel electrode PXE2, and a third pixel electrode PXE3. The first pixel electrode PXE1 may be an anode of the light emitting element EMD of the first subpixel. The second pixel electrode PXE2 may be an anode of the light emitting element EMD of the second subpixel. The third pixel electrode PXE3 may be an anode of the light emitting element EMD of the third subpixel.

The first pixel electrode PXE1 may be disposed adjacent to the right side of the center of the pixel PX. The first pixel electrode PXE1 may be located at a position overlapping or facing the data signal lines 1310, 1320, 1330, 1410, 1420 and 1430 of the first data conductive layer 1300 and the second data conductive layer 1400. The first pixel electrode PXE1 may contact the thirty-first conductive pattern 1480a through an eleventh contact hole CNT1 which may penetrate the planarization layer 1080 to expose the thirty-first conductive pattern 1480a. The first pixel electrode PXE1 may be electrically connected to the source electrode of the driving transistor DRT of the first subpixel through the thirty-first conductive pattern 1480a.

The second pixel electrode PXE2 may be disposed adjacent to the center of the pixel PX. The second pixel electrode PXE2 may be located at a position overlapping or facing the conductive patterns 1380 and 1480 of the first data conductive layer 1300 and the second data conductive layer 1400. The second pixel electrode PXE2 may contact the thirty-second conductive pattern 1480b through a twelfth contact hole CNT12. The second pixel electrode PXE2 may be electrically connected to the source electrode of the driving transistor DRT of the second subpixel through the thirty-second conductive pattern 1480b.

The third pixel electrode PXE3 may be disposed on the left side of the center of the pixel PX. The third pixel electrode PXE3 may be disposed at a position overlapping or facing the first voltage wiring 1350, the third voltage wiring 1450, and the reference voltage wirings 1360 and 1460 of the first data conductive layer 1300 and the second data conductive layer 1400. The third pixel electrode PXE3 may contact the thirty-third conductive pattern 1480c through a thirteenth contact hole CNT13. The third pixel electrode PXE3 may be electrically connected to the source electrode of the driving transistor DRT of the third subpixel through the thirty-third conductive pattern 1480c.

The display device 1 may include the electrode pattern PXP disposed in the pixel electrode layer. The electrode pattern PXP may be disposed on the same layer as the pixel electrodes PXE and may overlap or face the second voltage wiring 1370 and the fourth voltage wiring 1470 to which the second power supply voltage ELVS may be applied. For example, the electrode pattern PXP may be disposed in the opening area LDA of each pixel PX, and at least a portion of the electrode pattern PXP may overlap or face the first expanded portion EP1 of the second voltage wiring 1370 and the second expanded portion EP2 of the fourth voltage wiring 1470 in the thickness direction. The electrode pattern PXP may include a third expanded portion EP3 and a protruding portion PP. As described below, the third expanded portion EP3 may contact the common electrode CME, and the protruding portion PP may contact the data conductive layers 1300 and 1400 located under the protruding portion PP. The pixel defining layer PDL may be disposed on the pixel electrode layer and the planarization layer 1080. The pixel defining layer PDL may include openings OPH. The pixel defining layer PDL of some pixels PX may include the hole HLD. Where the openings OPH and the hole HLD are located is illustrated, for example, in FIG. 7. The openings OPH may partially expose the pixel electrodes PXE, respectively. The openings OPH may include a first opening OPH1, a second opening OPH2, and a third opening OPH3. The first opening OPH1 may be located on the first pixel electrode PXE1 to expose a portion of the first pixel electrode PXE1. The second opening OPH2 may be located on the second pixel electrode PXE2 to expose a portion of the second pixel electrode PXE2. The third opening OPH3 may be located on the third pixel electrode PXE3 to expose a portion of the third pixel electrode PXE3. As described above, the light emitting layer EML and the common electrode CME may be disposed on the pixel defining layer PDL and the pixel electrodes PXE of the entire pixel PX. The light emitting layer EML may contact the pixel electrodes PXE exposed by the openings OPH and may emit light by receiving electrical signals from the pixel electrodes PXE and the common electrode CME disposed above the pixel electrodes PXE.

The light emitting layer EML may not be disposed in the hole HLD of the opening area LDA. The hole HLD may be disposed at a position overlapping or facing the electrode pattern PXP and may penetrate the pixel defining layer PDL to expose a portion of the electrode pattern PXP. During manufacture of the display device 1, the hole HLD may be formed after the light emitting layer EML may be placed over the entire pixel PX. Therefore, the light emitting layer EML may not be disposed on the electrode pattern PXP that may be exposed through the hole HLD. Accordingly, the common electrode CME disposed on the light emitting layer EML over the entire pixel PX may contact the electrode pattern PXP through the hole HLD.

The common electrode CME of the display device 1 may be electrically connected to the second voltage wiring 1370 and/or the fourth voltage wiring 1470 of some pixels PX in order to suppress a drop of the second power supply voltage ELVS. The common electrode CME may contact the electrode pattern PXP through the hole HLD in the opening area LDA of each pixel PX. The electrode pattern PXP may contact the data conductive layers 1300 and 1400, which may be exposed through a contact hole, for example, a fifteenth contact hole CNT15 that may penetrate the planarization layer 1080, in the opening area LDA. The hole HLD through which the common electrode CME may contact the electrode pattern PXP may be spaced apart from the fifteenth contact hole CNT15 through which the electrode pattern PXP contacts the data conductive layers 1300 and 1400. Thus, in a display device 1 having high resolution via inclusion of a large number of pixels PX, the area of one pixel PX may be minimized due to spacing of the hole HLD from, for example, the fifteenth contact hole CNT15.

The hole HLD, which may be an area where the common electrode CME may contact the electrode pattern PXP, may not overlap or face, in the thickness direction, the fifteenth contact hole CNT15, which may be an area where the electrode pattern PXP may contact the data conductive layers 1300 and 1400. Therefore, a width of the fifteenth contact hole CNT15 located under the hole HLD may be minimized.

Electrode pads 1500 may be disposed in a contact hole through which the pixel electrode layer may contact the second data conductive layer 1400. Examples include the fifteenth contact hole CNT15 through the electrode pattern PXP may contact the fourth voltage wiring 1470 and in the eleventh through thirteenth contact holes CNT1 through CNT13 through which the pixel electrodes PXE contact the third conductive patterns 1480, respectively. The electrode pads 1500 may be disposed in areas where the pixel electrode layer contacts the second data conductive layer 1400 to lower the contact resistance between the pixel electrode layer and the second data conductive layer 1400. However, embodiments may not be limited thereto, wherein the electrode pads 1500 may be omitted.

Figure 8:
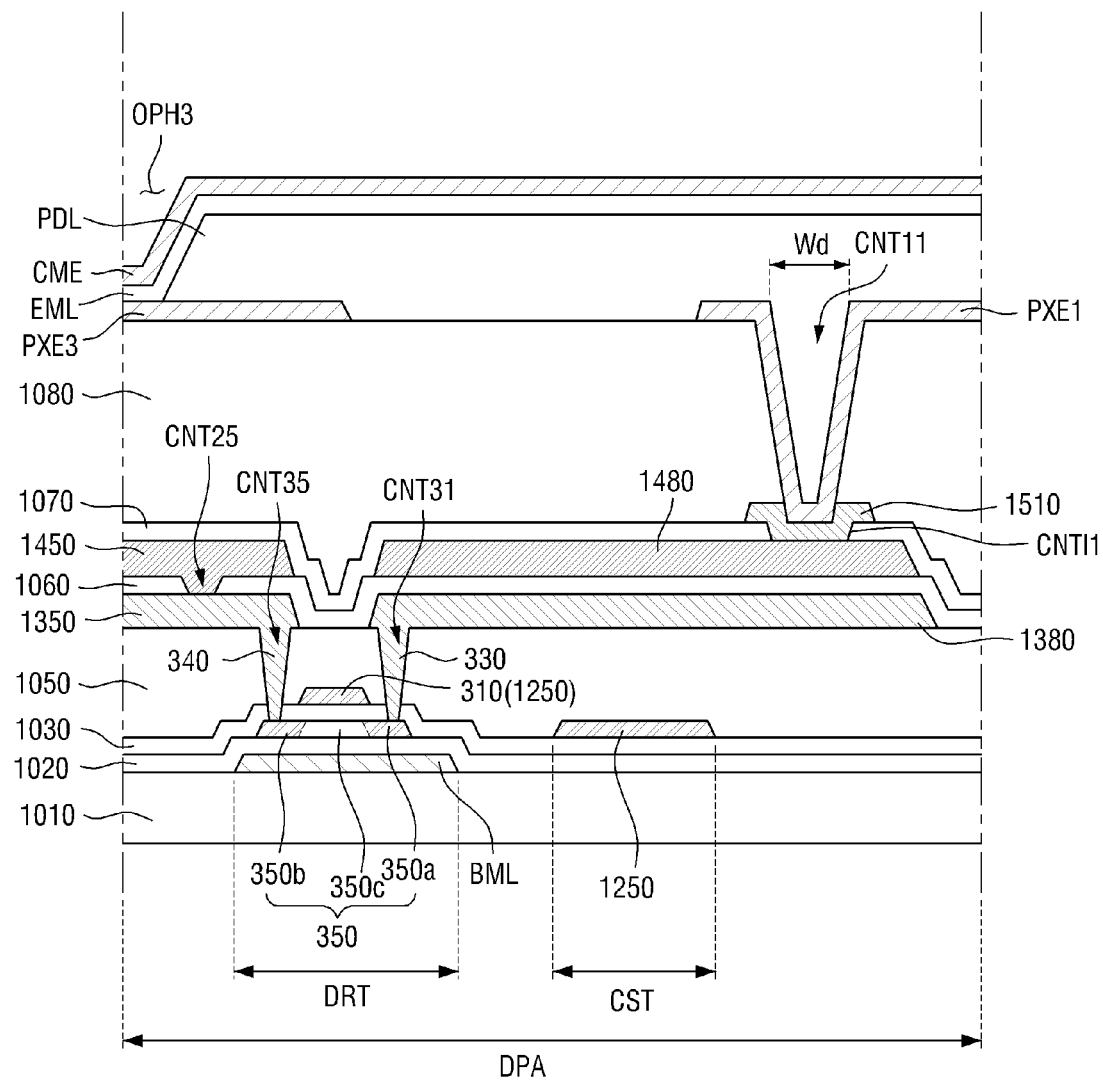
FIG. 8 shows a schematic cross-sectional view taken along line IX-IX' of FIG. 5.

FIG. 8 shows a schematic cross-sectional view taken along line IX-IX' of FIG. 5.

FIG. 8 shows a cross section of the driving transistor DRT, the storage capacitor CST and the first pixel electrode PXE1 of only the first subpixel of one pixel PX of the display device 1. FIG. 8 shows the pixel defining layer PDL, the light emitting layer EML and the common electrode CME as well as the stacked structure of the circuit layer CCL. The description below with reference to FIG. 8 may be applied to other subpixels.

The driving transistor DRT shown in FIG. 8 may include a first active layer 350, a first gate electrode 310, a first source electrode 330, a first drain electrode 340, and the light blocking layer BML. The first active layer 350, the first gate electrode 310, the first source electrode 330, and the first drain electrode 340 of the driving transistor DRT may be portions of a first semiconductor layer 1110, a gate conductive pattern 1250, a first conductive pattern 1380, and the first voltage wiring 1350, respectively. For example, it may be understood that, in FIG. 8, a semiconductor layer and portions of conductive layers form one driving transistor DRT. The first substrate 1010 may bean insulating substrate, and include a transparent material.

The buffer layer 1020 may be disposed on the first substrate 1010. The buffer layer 1020 may protect the driving transistor DRT and the first and second switching transistors SCT and SST of the pixel PX from moisture introduced through the first substrate 1010. The buffer layer 1020 may be composed of alternately stacked inorganic layers. For example, the buffer layer 1020 may be a multi-layer in which one or more inorganic layers selected from a silicon oxide (SiOx) layer, a silicon nitride (SiNx) layer, and silicon oxynitride (SiON) may be alternately stacked.

The light blocking layer BML may be disposed between the first substrate 1010 and the buffer layer 1020 of the display device 1. The light blocking layer BML may overlap or face the first active layer 350 of the driving transistor DRT. The light blocking layer BML may block light from the first substrate 1010 from entering the first active layer 350 of the driving transistor DRT, thereby preventing a leakage current from flowing through the first active layer 350. A width of the light blocking layer BML may be greater than that of the first active layer 350 of the driving transistor DRT. The light blocking layer BML may cover a channel region of the first active layer 350, but embodiments may not be limited thereto. Since FIG. 8 shows the cross section of only a portion of one pixel PX, the light blocking layer BML may be shown as not contacting the first source electrode 330. The light blocking layer BML may contact the first source electrode 330 through a forty-first contact hole CNT41 exposing a portion of the light blocking layer BML. Therefore, the light blocking layer BML may suppress a change in the voltage of the driving transistor DRT. The light blocking layer BML may be a Ti/Cu double layer in which a titanium layer and a copper layer may be stacked.

The first active layer 350 or the first semiconductor layer 1110 disposed on the buffer layer 1020. Although FIG. 8 shows only the first active layer 350 of the driving transistor DRT, active layers of other transistors, i.e., the first switching transistor SCT and the second switching transistor SST may also be disposed on the buffer layer 1020. The first active layer 350 may include a first conductive region 350a, a second conductive region 350b, and the channel region 350c. The first conductive region 350a may contact the first source electrode 330, and the second conductive region 350b may contact the first drain electrode 340.

The first active layer 350 may include an oxide semiconductor as described above, but embodiments may not be limited thereto. Some of the semiconductor layers disposed on the buffer layer 1020 may include polysilicon.

The gate insulating layer 1030 may be disposed on the first active layer 350. The first gate insulating layer 1030 may be made of an inorganic material such as silicon oxide (SiOx) or silicon nitride (SiNx) or may be formed in a structure in which SiOx and SiNx are stacked. Although the gate insulating layer 1030 may be disposed on the entire surface of the buffer layer 1020 as well as the first active layer 350, embodiments may not be limited thereto. For example, the gate insulating layer 1030 may be formed only on the first active layer 350.

The first gate electrode 310 and the first electrode of the storage capacitor CST may be disposed on the gate insulating layer 1030. The first gate electrode 310 and the first electrode of the storage capacitor CST may be the gate conductive pattern 1250 described above with reference to FIGS. 5 through 7.

The first gate electrode 310 may overlap or face the first active layer 350 with the gate insulating layer 1030 interposed therebetween. The first gate electrode 310 may overlap or face the channel region 350c of the first active layer 350.

The interlayer insulating layer 1050 may be disposed on the first gate electrode 310 and the first electrode of the storage capacitor CST. The interlayer insulating layer 1050 may be made of an inorganic material such as silicon oxide (SiOx) or silicon nitride (SiNx) or may be formed of a stack of SiOx and SiNx.

A thirty-first contact hole CNT31 and a thirty-fifth contact hole CNT35 may be formed in the interlayer insulating layer 1050. The thirty-first contact hole CNT31 may expose the first conductive region 350a of the first active layer 350, and the thirty-fifth contact hole CNT35 may expose the second conductive region 350b of the first active layer 350. A contact hole, e.g., the forty-first contact hole CNT41 exposing a portion of the light blocking layer BML, may also be formed in the interlayer insulating layer 1050. Additional contact holes may be formed in the interlayer insulating layer 1050 as described above.

The first data conductive layer 1300 may be disposed on the interlayer insulating layer 1050. The first conductive pattern 1380 of the first data conductive layer 1300 may contact the first conductive region 350a of the first active layer 350 through the thirty-first contact hole CNT31. The first conductive pattern 1380 may form the first source electrode 330 of the driving transistor DRT. The first conductive pattern 1380 may overlap or face the gate conductive pattern 1250 and form the second electrode of the storage capacitor CST. The first voltage wiring 1350 of the first data conductive layer 1300 may contact the second conductive region 350b of the first active layer 350 through the thirty-fifth contact hole CNT35. The first voltage wiring 1350 may form the first drain electrode 340 of the driving transistor DRT.

In an embodiment, the first protective layer 1060 may be disposed on the first data conductive layer 1300. In other embodiments, the first protective layer 1060 may be disposed on the first data conductive layer 1300 or the first source electrode 330 and the first drain electrode 340 of the driving transistor DRT. The first protective layer 1060 may include an inorganic material such as silicon oxide (SiOx) or silicon nitride (SiNx) or may be formed as a stack of SiOx and SiNx. The twenty-fifth contact hole CNT25 may be formed in the first protective layer 1060 to penetrate the first protective layer 1060 and expose a portion of the first voltage wiring 1350. Although not shown, a twenty-eighth contact hole may be formed in the first protective layer 1060 to expose a portion of the first conductive pattern 1380.

The second data conductive layer 1400 may be disposed on the first protective layer 1060. The third voltage wiring 1450 of the second data conductive layer 1400 may contact the first voltage wiring 1350 through the twenty-fifth contact hole CNT25. Although not shown, the third conductive pattern 1480 may contact the first conductive pattern 1380 through the twenty-eighth contact hole CNT28.

The second protective layer 1070 may be disposed on the second data conductive layer 1400. The second protective layer 1070 may be made of an inorganic material such as silicon oxide (SiOx) or silicon nitride (SiNx) or may be formed as a stack of SiOx and SiNx.

The planarization layer 1080 may be disposed on the second protective layer 1070. The planarization layer 1080 may flatten steps formed by thin-film transistors such as the driving transistor DRT and the first switching transistor SCT.

The pixel electrode layer including the pixel electrodes PXE and the electrode pattern PXP may be disposed on the planarization layer 1080. FIG. 8 shows a portion of the first pixel electrode PXE1 and a portion of the third pixel electrode PXE3. The first pixel electrode PXE1 may contact the third conductive pattern 1480 through the eleventh contact hole CNT11.

The display device 1 may include the electrode pads 1500, and electrode contact holes CNTI exposing portions of the second data conductive layer 1400 may be formed in the second protective layer 1070. Each of the electrode contact holes CNTI may be formed in an area where a pixel electrode PXE contacts the second data conductive layer 1400, and the electrode pads 1500 may be disposed on the second protective layer 1070 and the second data conductive layer 1400 exposed through the electrode contact holes CNTI. As shown in FIG. 8, a first electrode contact hole CNTI1 may be formed in the second protective layer 1070 to expose a portion of the third conductive pattern 1480, and a first electrode pad 1510 may be disposed on the second protective layer 1070 and the third conductive pattern 1480. The first pixel electrode PXE1 may contact the third conductive pattern 1480 through the first electrode pad 1510. Accordingly, contact resistance between the first pixel electrode PXE1 and the third conductive pattern 1480 may be lowered.

Figure 9:
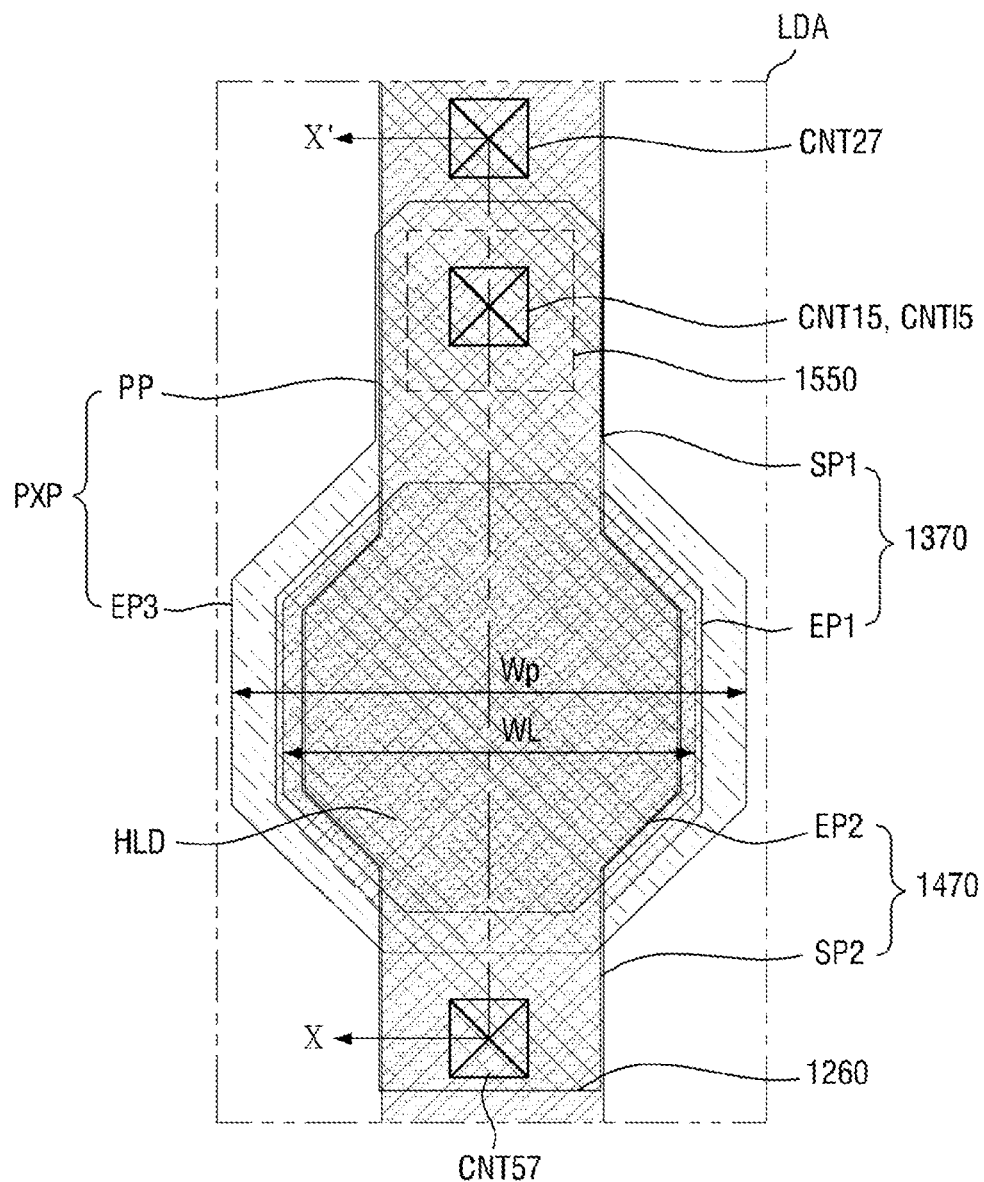
FIG. 9 shows an enlarged view of an opening area of FIG. 5.
Figure 10:
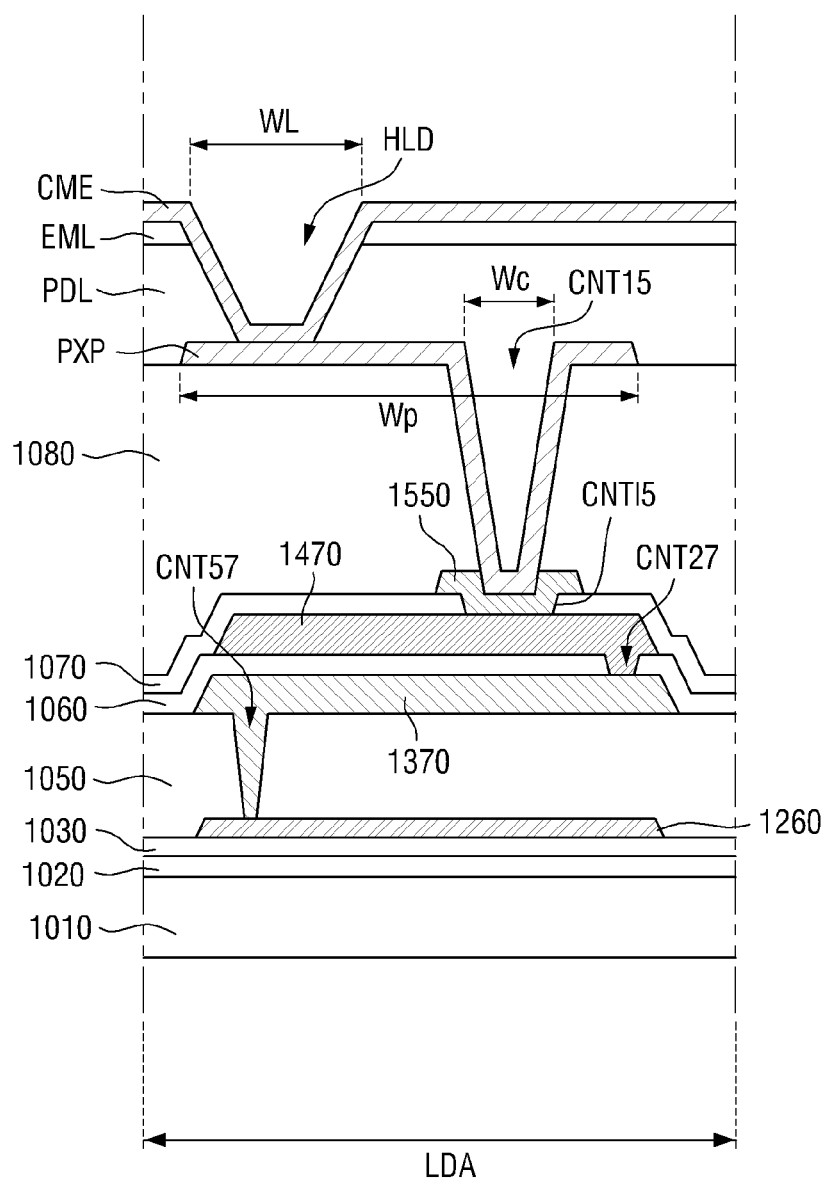
FIG. 10 shows a schematic cross-sectional view taken along line X-X' of FIG. 9.
Figure 11:
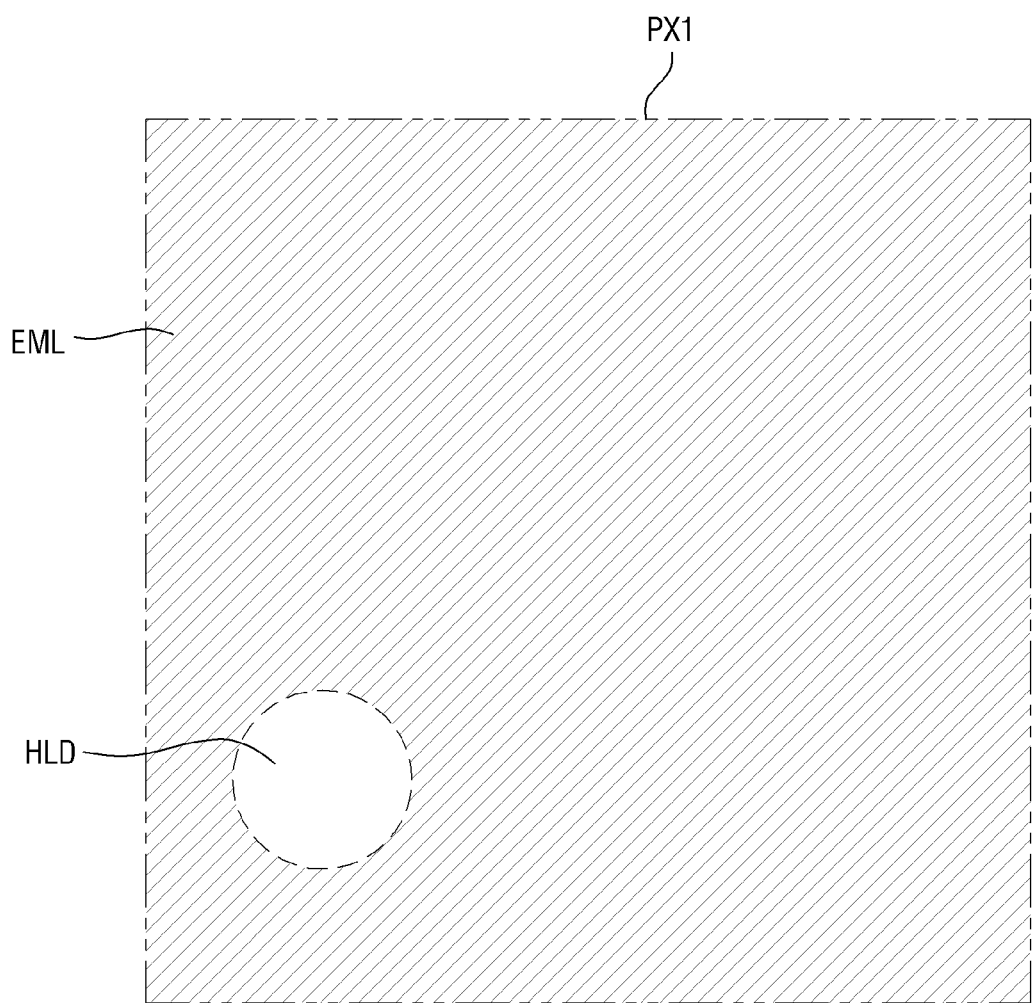
FIG. 11 shows a schematic plan view of a light emitting layer included in the pixel of FIG. 5.

The pixel defining layer PDL may be disposed on the planarization layer 1080. FIG. 8 shows a portion of the third opening OPH3 formed in the pixel defining layer PDL. The light emitting layer EML disposed on the pixel defining layer PDL may contact the third pixel electrode PXE3 exposed through the third opening OPH3. The common electrode CME may be disposed on the light emitting layer EML. FIG. 9 shows an enlarged plan view of the opening area LDA of FIG. 5. FIG. 10 shows a schematic cross-sectional view taken along line X-X' of FIG. 9. FIG. 11 shows a plan view of the light emitting layer EML included in the pixel PX of FIG. 5.

FIGS. 9 and 10 show a plan and a cross sectional view of the opening area LDA of one pixel PX of FIG. 5. FIG. 10 shows a cross section taken along line X-X' of FIG. 9 across the electrode pattern PXP. FIG. 11 shows a plan view of the light emitting layer EML disposed in the one pixel PX of FIG. 5.

Referring to FIGS. 9 through 11, the electrode pattern PXP may be disposed in the opening area LDA of the pixel PX. The electrode pattern PXP may contact the gate conductive layer 1200, the first data conductive layer 1300 and the second data conductive layer 1400 disposed under the electrode pattern PXP. The gate pattern portion 1260, the second voltage wiring 1370, and the fourth voltage wiring 1470 may be disposed in the opening area LDA. A second electrode pattern 1550 may be disposed in an area where the fourth voltage wiring 1470 and the electrode pattern PXP overlap or face each other. However, the second electrode pattern 1550 may be omitted. Although not shown, the pixel defining layer PDL may be disposed on the electrode pattern PXP in an area excluding the hole HLD, and the common electrode CME may be disposed on the pixel defining layer PDL. At least some pixels PX of the display device 1 may have the hole HLD in the opening area LDA, and the common electrode CME may contact the electrode pattern PXP in each of the pixels PX through the hole HLD.

Each of the second voltage wiring 1370, the fourth voltage wiring 1470, and the electrode pattern PXP may include an expanded portion EP. The second voltage wiring 1370 may include the first extension portion SP1 and the first expanded portion EP having a wider width than the first extension portion SP1. The fourth voltage wiring 1470 may include the second extension portion SP2 and the second expanded portion EP2. The first expanded portion EP1 and the second expanded portion EP2 may overlap or face each other in the thickness direction. The first extension portion SP1 and the second extension portion SP2 may contact each other through the twenty-seventh contact hole CNT27. The gate pattern portion 1260 may include an expanded portion and an extension portion, and the second voltage wiring 1370 may contact the gate pattern portion 1260 through the fifty-seventh contact hole CNT57. Since the gate pattern portion 1260, the second voltage wiring 1370, and the fourth voltage wiring 1470 may be electrically connected to each other, they may have the same electric potential in a case that the second power supply voltage ELVS may be applied to the second voltage wiring 1370 and the fourth voltage wiring 1470.

The electrode pattern PXP may include the third expanded portion EP3 and the protruding portion PP protruding from a side surface of the third expanded portion EP3. The third expanded portion EP3 may overlap or face the first expanded portion EP1 and the second expanded portion EP2, and the protruding portion PP may be disposed on the first extension portion SP1 and the second extension portion SP2. The hole HLD formed in the pixel defining layer PDL may be formed on the third expanded portion EP3 of the electrode pattern PXP.

A first width Wp of the third expanded portion EP3 of the electrode pattern PXP may be greater than a second width WL of the hole HLD. A portion of the electrode pattern PXP may be disposed under the pixel defining layer PDL and exposed through the hole HLD. The common electrode CME may contact only the portion of the electrode pattern PXP exposed through the hole HLD.

A width of the protruding portion PP of the electrode pattern PXP may be substantially the same as a width of the extension portion SP1 or SP2 of the second voltage wiring 1370 and/or the fourth voltage wiring 1470. The protruding portion PP of the electrode pattern PXP may overlap or face the fifteenth contact hole CNT15 formed in the planarization layer 1080. Accordingly, the electrode pattern PXP may contact the second voltage wiring 1370 and/or the fourth voltage wiring 1470 disposed under the electrode pattern PXP.

The hole HLD and the fifteenth contact hole CNT15 may not overlap or face each other in the thickness direction. The hole HLD may be formed to overlap or face the third expanded portion EP3 of the electrode pattern PXP, and the fifteenth contact hole CNT15 may be formed to overlap or face the protruding portion PP of the electrode pattern PXP. Thus, the hole HLD and the fifteenth contact hole CNT15 may be spaced apart from each other. The common electrode CME may contact the electrode pattern PXP, which may have the same electric potential as the second voltage wiring 1370 and the fourth voltage wiring 1470 to which the second power supply voltage ELVS may be applied, thereby preventing a voltage drop within the display area DPA. Since the hole HLD and the fifteenth contact hole CNT15 may be spaced apart from each other, they may be configured with narrow widths and secure a space in a pixel PX even in a case that a large number of pixels PX may be provided to obtain a high resolution display device 1.

The fifteenth contact hole CNT15 may not overlap or face the twenty-seventh contact hole CNT27 in the thickness direction. Similarly as in the case that the hole HLD and the fifteenth contact hole CNT15 do not overlap or face each other in the thickness direction, the fifteenth contact hole CNT15 between the electrode pattern PXP and the fourth voltage wiring 1470 may not overlap or face the twenty-seventh contact hole CNT27 between the fourth voltage wiring 1470 and the second voltage wiring 1370 in the thickness direction.

The display device 1 may include contact holes, and some of the contact holes may have different widths. The second width WL of the hole HLD may be greater than a third width Wc of the fifteenth contact hole CNT15. During manufacture of the display device 1, the hole HLD may be formed on the electrode pattern PXP in the opening area LDA by a laser irradiation process once the light emitting layer EML may be formed. Contact holes, e.g., the fifteenth contact hole CNT15 formed in other insulating layers including the planarization layer 1080, may be formed by a mask process. Accordingly, the second width WL of the hole HLD may be greater than the third width Wc of the fifteenth contact hole CNT15. Thus, the common electrode CME may contact the electrode pattern PXP over a wide area so as to enable a drop of the second power supply voltage ELVS applied to the common electrode CME to be effectively suppressed.

Contact holes CNT11, CNT12 and CNT13 through which the pixel electrodes PXE contact the third conductive patterns 1380 may be formed in the planarization layer 1080, together with the fifteenth contact hole CNT15. Some of the contact holes formed in the planarization layer 1080 may have different widths. Referring again to FIG. 8, the third width Wc of the fifteenth contact hole CNT15 may be greater than a fourth width Wd of each of the eleventh through thirteenth contact holes CNT11 through CNT13. Since the eleventh through thirteenth contact holes CNT11 through CNT13 may be formed to enable the pixel electrodes PXE to contact the third conductive patterns 1480, they may have narrower widths than the fifteenth contact hole CNT15 that may be formed to suppress a voltage drop.

The hole HLD may be formed in only some pixels PX and may not be formed in other pixels PX adjacent thereto. The electrode pattern PXP may be disposed in the opening area LDA of each pixel PX, but only some of the pixels PX may include the hole HLD so that the common electrode CME may contact the electrode patterns PXP, and other pixels PX may not include the hole HLD.

Figure 12:
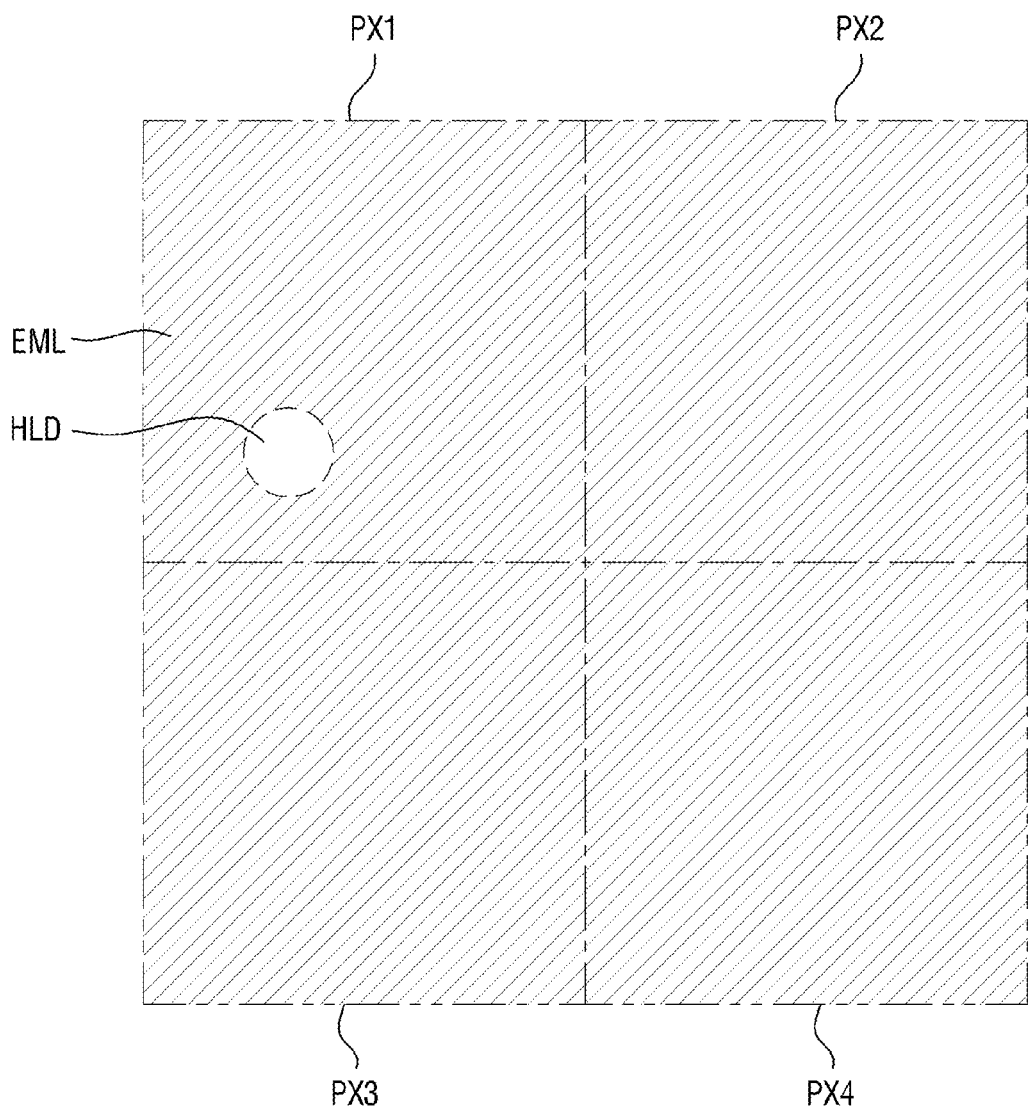
FIG. 12 shows a schematic plan view of the light emitting layer disposed in pixels according to an embodiment.
Figure 13:
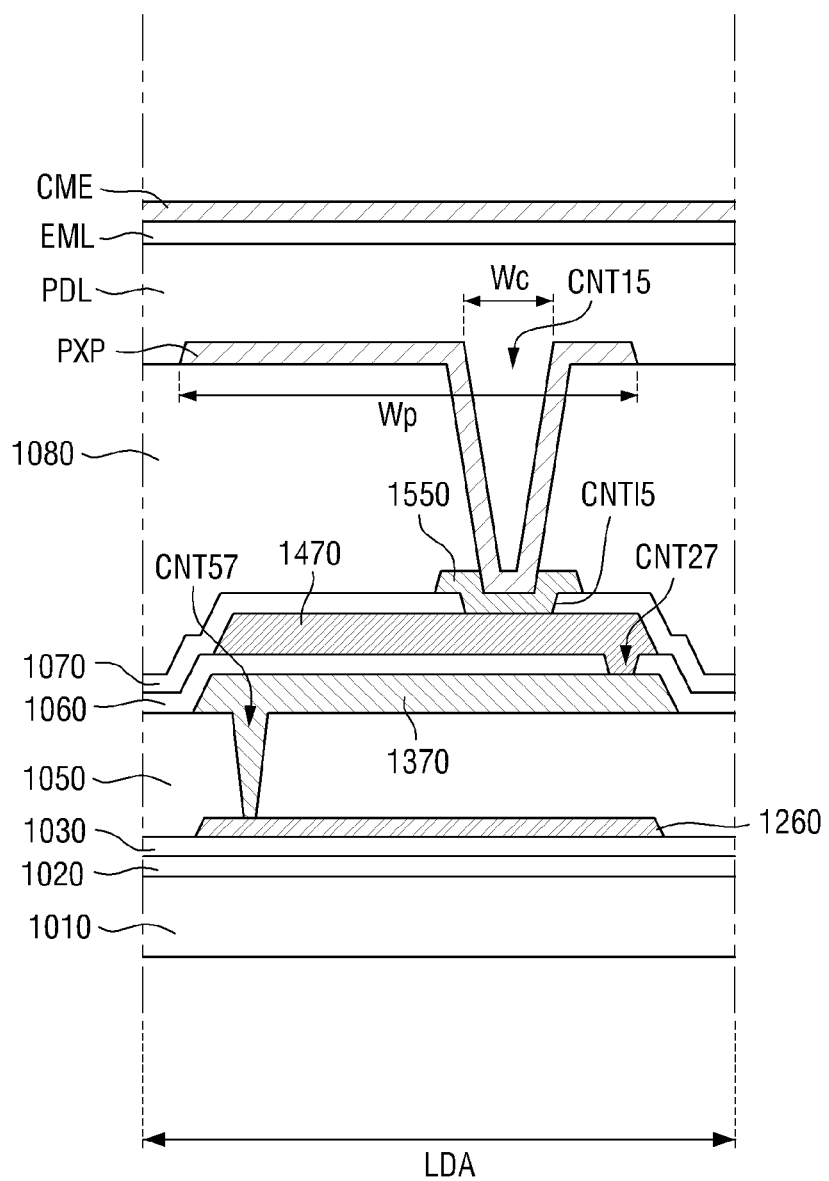
FIG. 13 shows a schematic cross-sectional view of the opening area of one pixel of FIG. 12.

FIG. 12 shows a schematic plan view of the light emitting layer EML disposed in pixels according to an embodiment. FIG. 13 shows a schematic cross-sectional view of the opening area LDA of one pixel PX of FIG. 12.

Referring to FIGS. 12 and 13 as well as FIG. 11, the display device 1 may include a first pixel PX1 having the hole HLD and pixels PX, e.g., second through fourth pixels PX2 through PX4, not having the hole HLD. FIG. 12 shows only the light emitting layer EMIL disposed in pixels, and thus while the first pixel PX1 includes the hole HLD in which the light emitting layer EML may not be disposed, the second through fourth pixels PX2 through PX4 may not include the hole HLD. FIG. 10 may be a cross section of the opening area LDA of the first pixel PX1.

FIG. 13 shows a cross section of the opening area LDA of each of the second through third pixels PX2 through PX4. In each of the second through fourth pixels PX2 through PX4, the hole HLD may not be formed therein, and the common electrode CME may not contact the electrode pattern PXP. Since the common electrode CME of the first pixel PX1 contacts the electrode pattern PXP, which may have the same electric potential as the second power supply voltage ELVS, a voltage drop of the common electrode CME disposed in pixels adjacent to the first pixel PX1 may also be suppressed. Accordingly, a laser process for forming the hole HLD may be performed on all or some of the pixels PX.

Although the hole HLD may be shown as being formed in only one (e.g., the first pixel PX1) of the four pixels PX, embodiments may not be limited thereto. One pixel having the hole HLD, for example, the first pixel PX1, may be the only pixel PX to include the hole among three or more pixels PX. For example, the hole HLD may be formed in only one of every four or more pixels PX.

The hole HLD may be formed in at least some pixels PX so that portions of the common electrode CME may contact the electrode patterns PXP having the same electric potential as the second power supply voltage ELVS. Therefore, a voltage drop of the common electrode CME may be suppressed in a high-resolution display device 1 including a large number of pixels PX.

The fifteenth contact hole CNT15 exposing the second voltage wiring 1370 and/or the fourth voltage wiring 1470 may be spaced apart from the hole HLD exposing the electrode pattern PXP. Therefore, the hole HLD and the fifteenth contact hole CNT15 may be formed to have relatively narrow widths, and a space in which the hole HLD and the fifteenth contact hole CNT15 may be formed in each pixel PX may be minimized.

FIGS. 14 through 21 show schematic cross-sectional views illustrating a method of manufacturing a display device according to an embodiment.

FIGS. 14 through 21 show an area where a driving transistor DRT may be disposed in the display area DPA and the opening area LDA. Thus, FIGS. 14 through 21 may indicate configurations shown in FIGS. 8 and 10.

Figure 14:
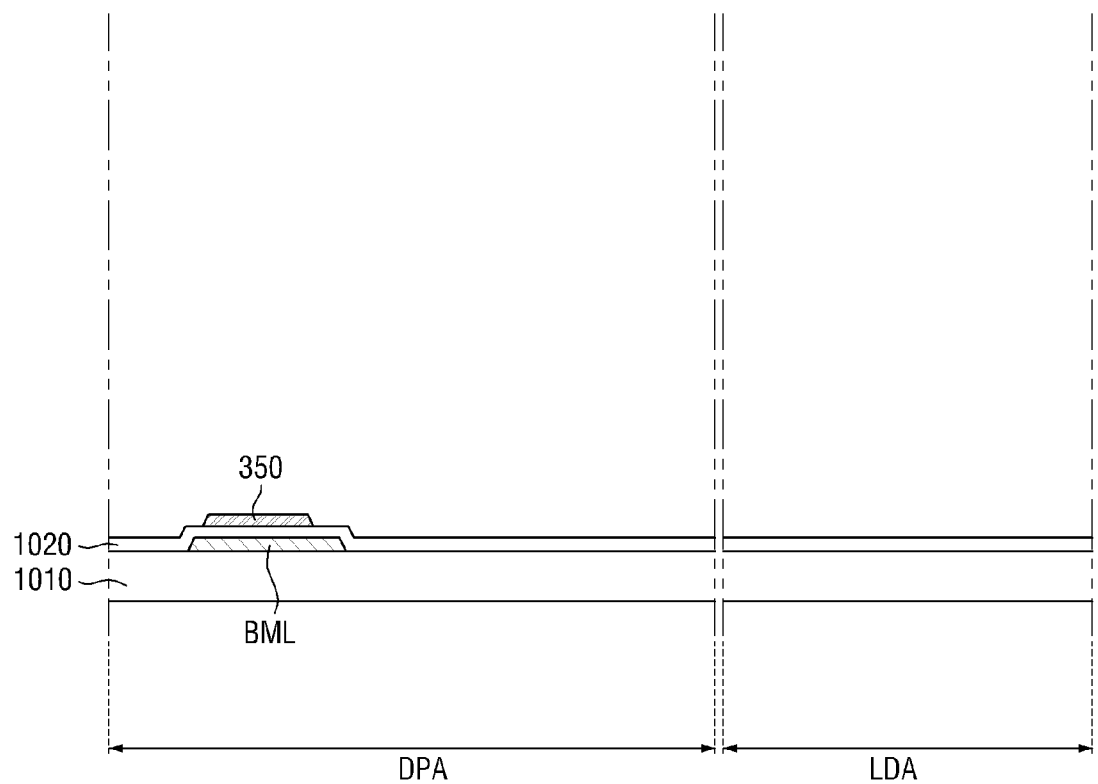
FIGS. 14 through 21 show schematic cross-sectional views illustrating a method of manufacturing a display device according to an embodiment.

Referring to FIG. 14, the light blocking layer BML may be formed on the first substrate 1010. The patterned light blocking layer BML may be formed by a mask process. For example, once a material layer for forming a lower metal layer may be deposited on the entire surface of the first substrate 1010, that material layer may be patterned by a photolithography process to form the light blocking layer BML as illustrated in FIG. 14.

The buffer layer 1020 and the semiconductor layer 1100 may be formed on the first substrate 1010 on which the light blocking layer BML may be formed. FIG. 14 shows the first active layer 350 of the driving transistor DRT of the semiconductor layer 1100. The semiconductor layer 1100 may be formed by a mask process. For example, an oxide semiconductor may be deposited on the entire surface of the buffer layer 1020 and then patterned by a photolithography process to form the semiconductor layer 1100 as illustrated in FIG. 14.

Figure 15:
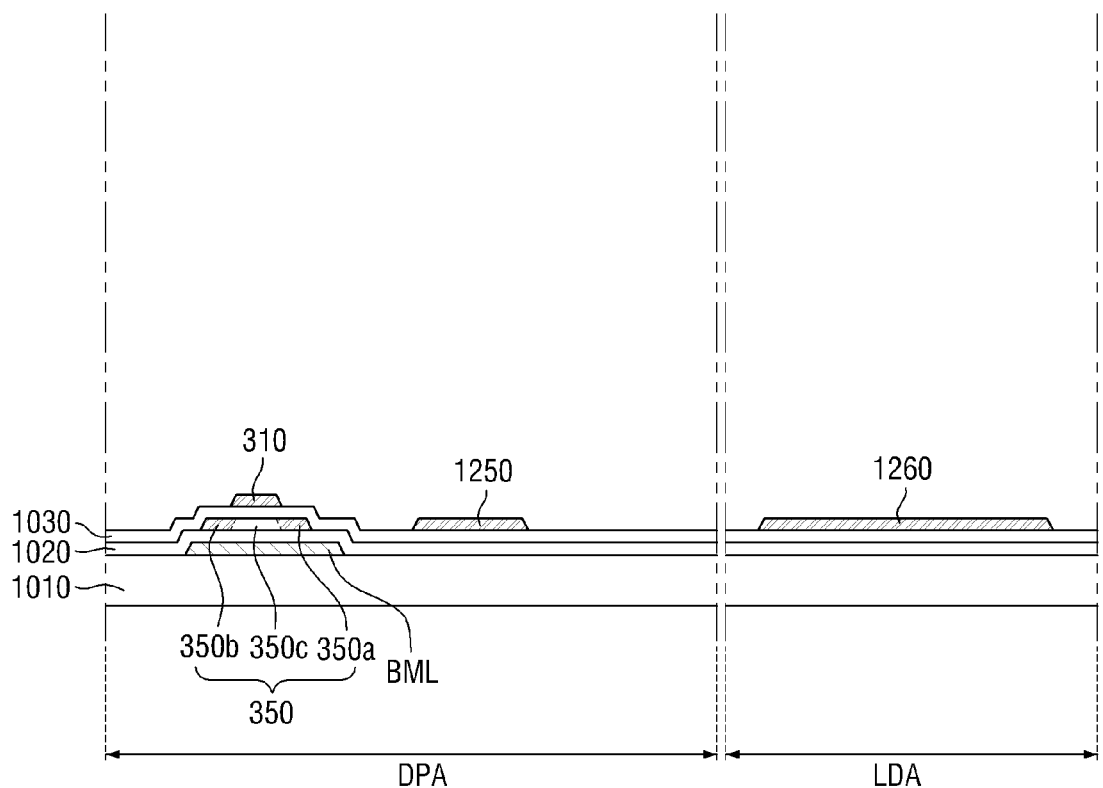

Referring to FIG. 15, the gate insulating layer 1030 may be formed on the semiconductor layer 1100. The gate conductive layer 1200 may be formed on the gate insulating layer 1030. FIG. 15 shows a gate conductive pattern 1250 including the first gate electrode 310 of the gate conductive layer 1200 and the gate pattern portion 1260. The gate conductive pattern 1250 may be formed by a process used to form the buffer layer 1020 or the process used to form the light blocking layer BML.

Figure 16:
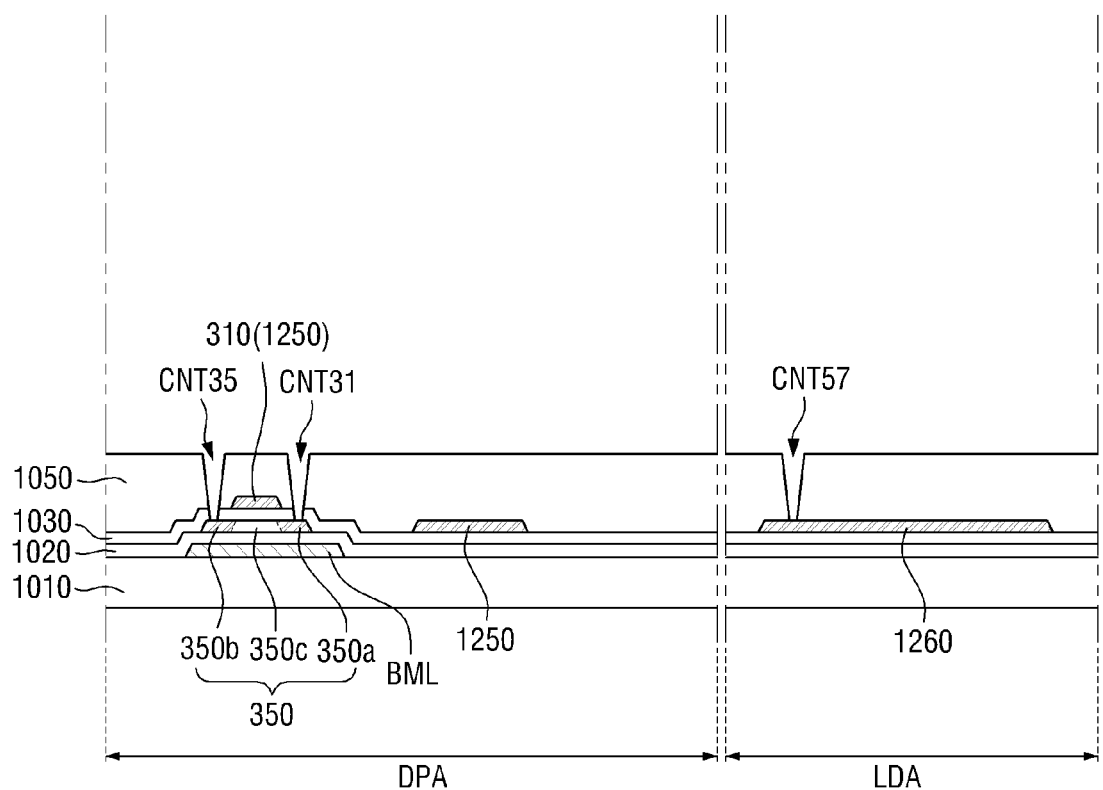

Referring to FIG. 16, the interlayer insulating layer 1050 may be formed on the gate insulating layer 1030 on which the gate conductive layer 1200 may be formed, and a thirty-first contact hole CNT31 and a thirty-fifth contact hole CNT35 exposing portions of the first active layer 350 and the fifty-seventh contact hole CNT57 may be formed. The contact hole formation process may be a mask process.

Figure 17:
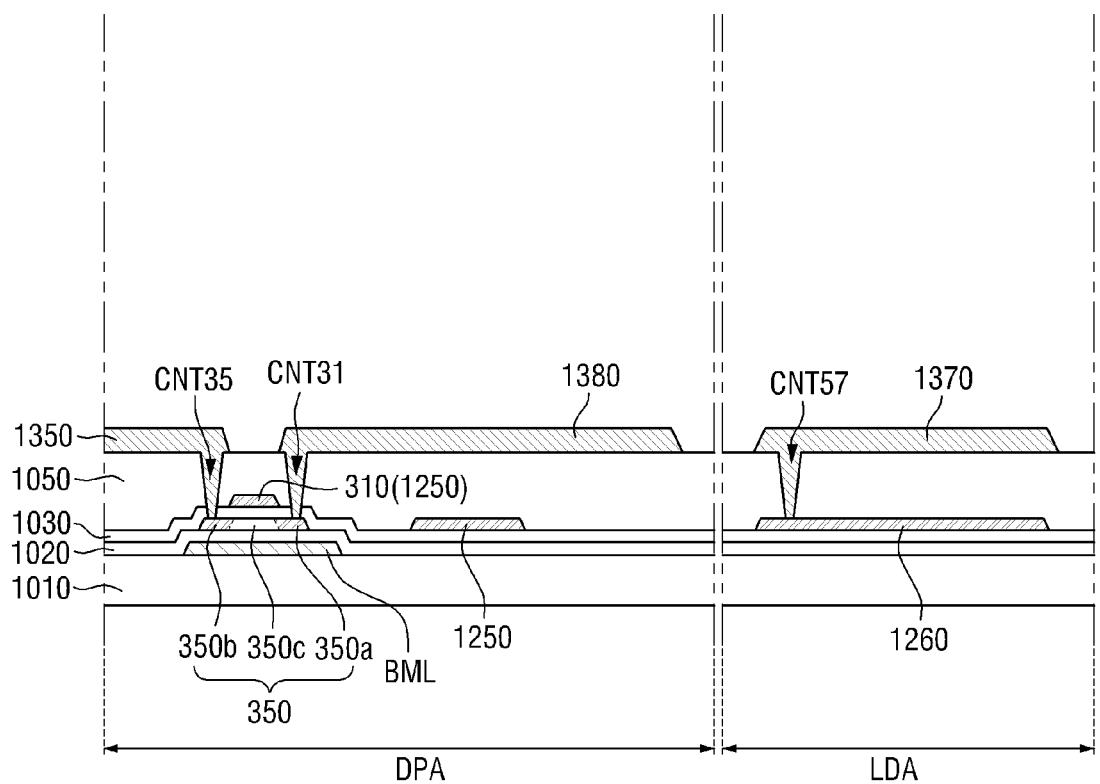
Figure 18:
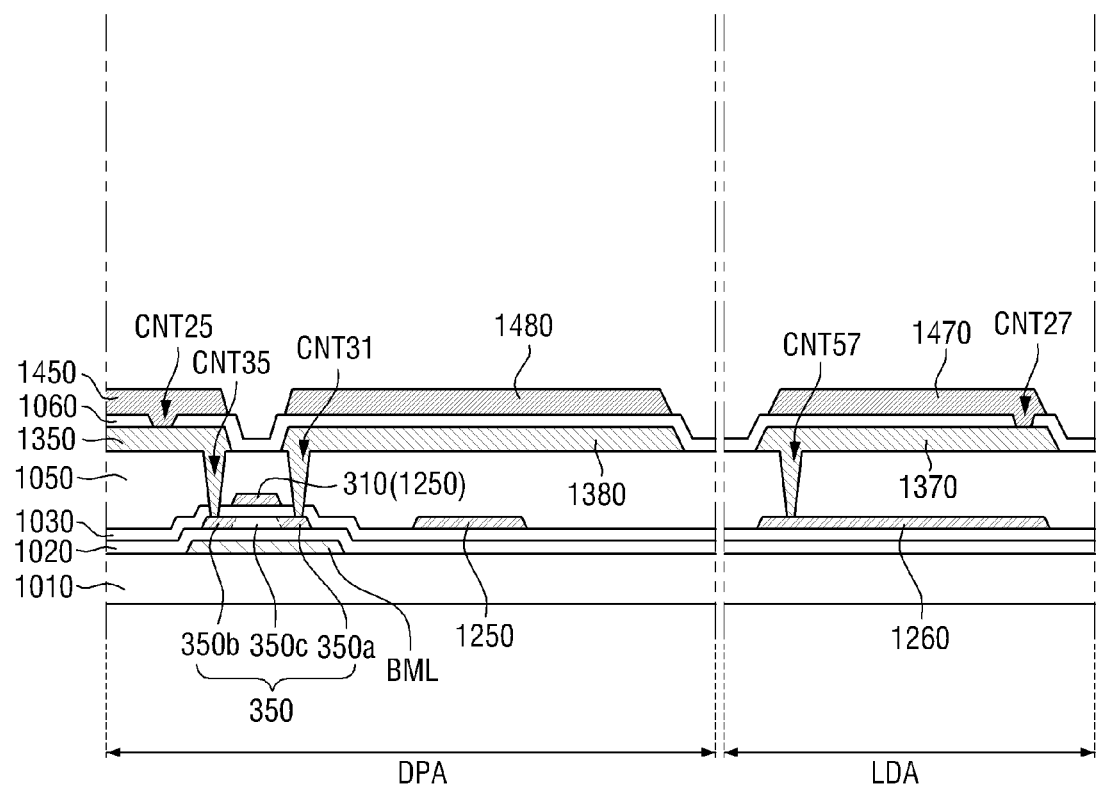
Figure 19:
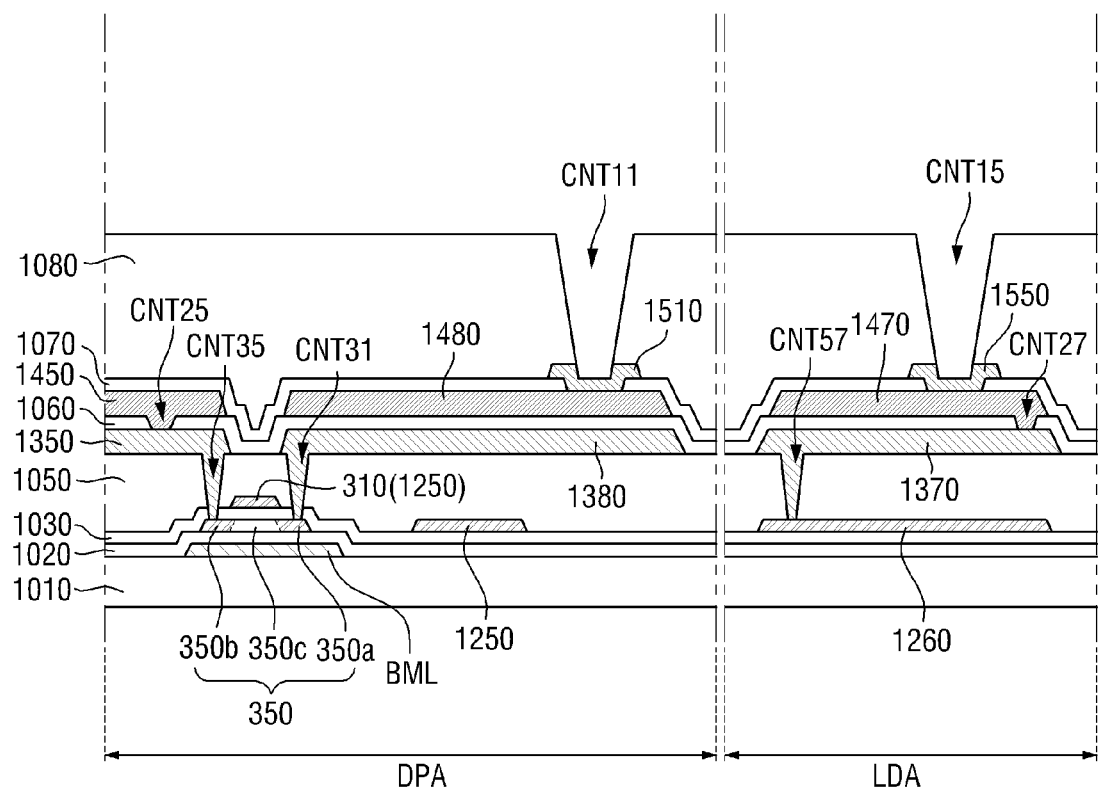

Referring to FIGS. 17 and 18, the first data conductive layer 1300 and the first protective layer 1060 may be formed on the interlayer insulating layer 1050, and the second data conductive layer 1400 may be formed on the first protective layer 1060. In these regards, the first voltage wiring 1350, a first conductive pattern 1380 and the second voltage wiring 1370 of the first data conductive layer 1300 may be provided. The third voltage wiring 1450, a third conductive pattern 1480 and the fourth voltage wiring 1470 of the second data conductive layer 1400 may also be provided. Referring to FIG. 19, the second protective layer 1070 and the planarization layer 1080 may be formed on the second data conductive layer 1400, and contact holes may be formed in the second protective layer 1070 and the planarization layer 1080. The eleventh contact hole CNT11 overlapping or facing a pixel electrode PXE and the fifteenth contact hole CNT15 overlapping or facing an electrode pattern PXP may be formed. The electrode pads 1500 may be disposed between the second protective layer 1070 and the planarization layer 1080. A process of forming the electrode contact holes CNTI in the second protective layer 1070 may be performed before the formation of the planarization layer 1080.

Figure 20:
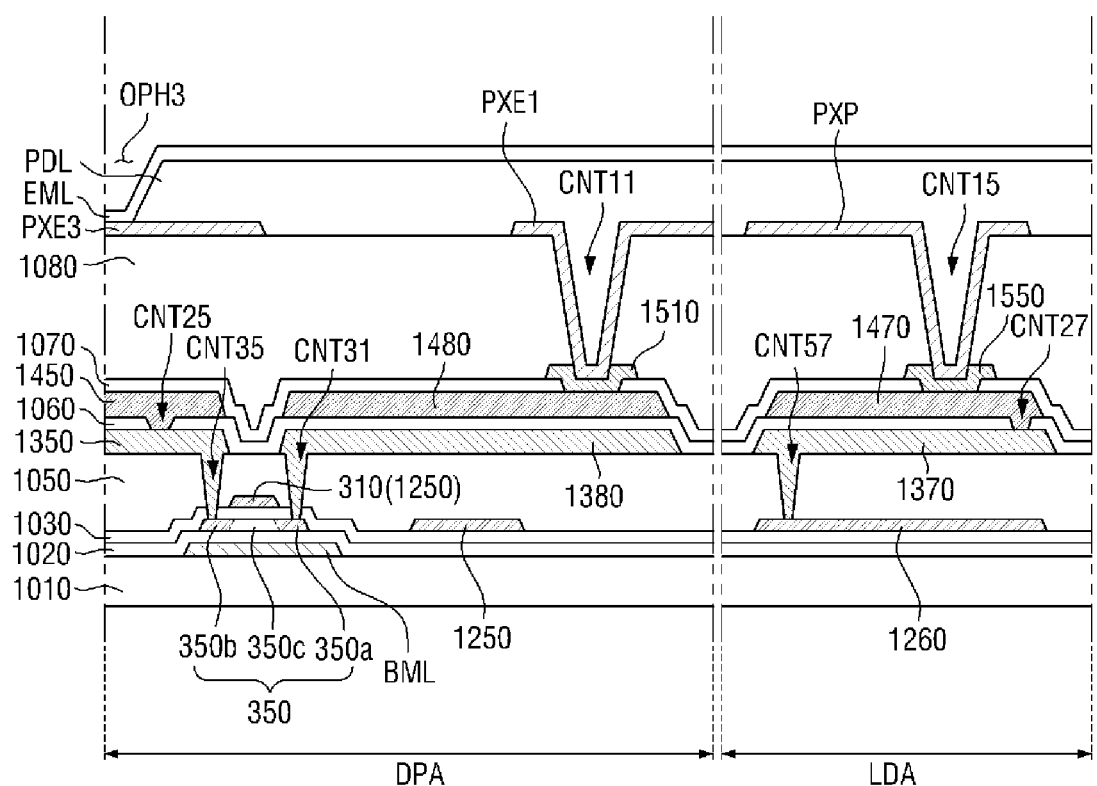

Referring to FIG. 20, the pixel electrode layer and the pixel defining layer PDL may be formed on the planarization layer 1080, and the light emitting layer EML may be formed on the pixel electrode layer and the pixel defining layer PDL. The pixel electrode layer may include pixel electrodes PXE and the electrode pattern PXP. The light emitting layer EML may be disposed once a process of forming openings OPH in the pixel defining layer PDL may be completed. The light emitting layer EML may be disposed in the opening area LDA as well as in the entire display area DPA.

Figure 21:
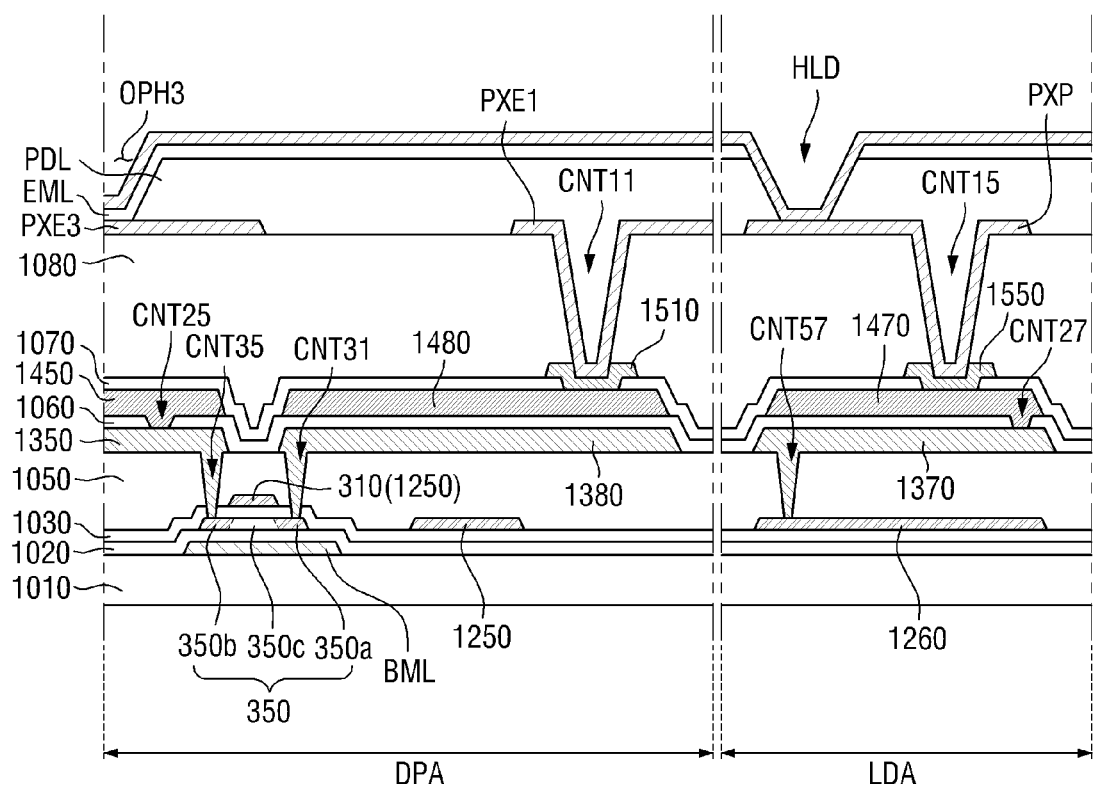

Finally, referring to FIG. 21, the hole HLD may be formed in the pixel defining layer PDL of the opening area LDA, and the common electrode CME may be placed in the hole HLD. The hole HLD may be formed by a laser irradiation process as described above. Since the hole HLD may be formed once the process of forming the light emitting layer EML may be completed, the light emitting layer EML may be removed from the hole HLD. The common electrode CME may overlap or face a pixel electrode PXE exposed through an opening OPH, with the light emitting layer EML interposed between the common electrode CME and the pixel electrode PXE, and may contact the electrode pattern PXP exposed through the hole HLD.

Figure 22:
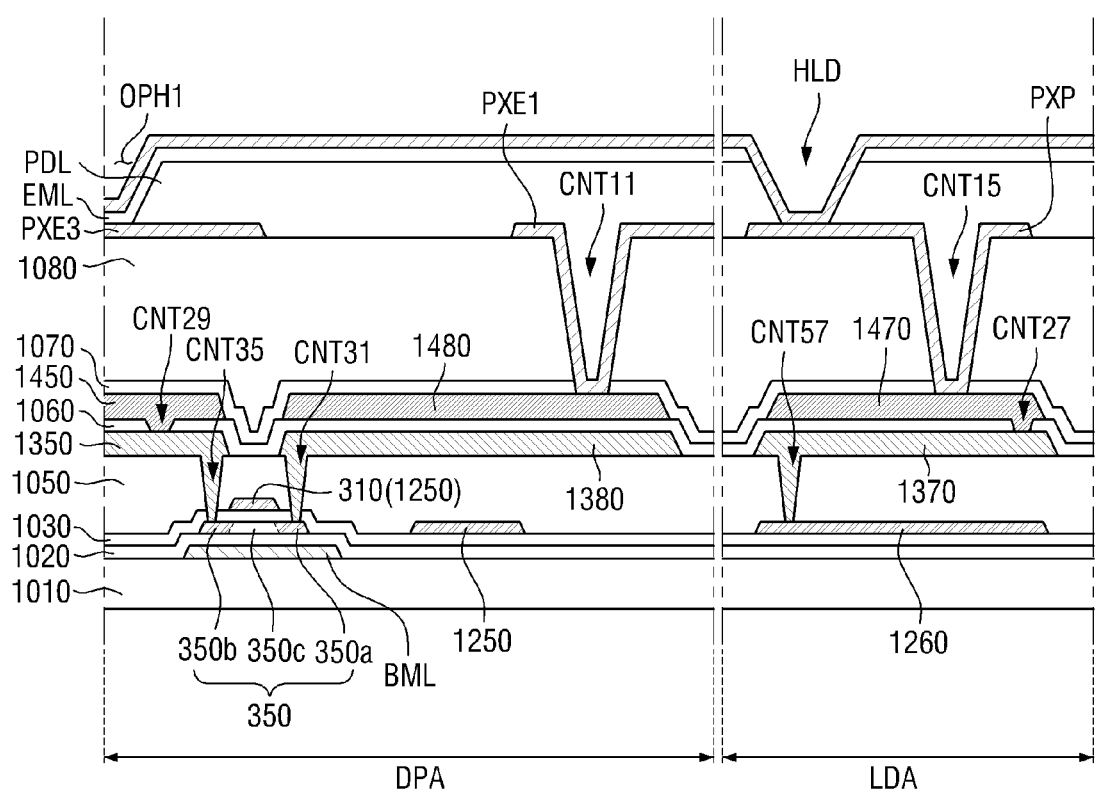
FIG. 22 shows a schematic cross-sectional view of a first display substrate of a display device according to an embodiment.

FIG. 22 shows a schematic cross-sectional view of a first display substrate 10 of a display device 1 according to an embodiment, in which a display area DPA and an opening area LDA of the first display substrate 10 of the display device 1 may be provided. Electrode pads 1500 disposed between a pixel electrode layer and a second data conductive layer 1400 may be omitted. An eleventh contact hole CNT11 may penetrate a planarization layer 1080 and a second protective layer 1070 to directly expose a portion of a third conductive pattern 1380 of the second data conductive layer 1400. A pixel electrode PXE, for example, a first pixel electrode PXE1, may directly contact the third conductive pattern 1380 through the eleventh contact hole CNT11. A fifteenth contact hole CNT15 may penetrate the planarization layer 1080 and the second protective layer 1070 to directly expose a fourth voltage wiring 1470 of the second data conductive layer 1400. An electrode pattern PXP may directly contact the fourth voltage wiring 1470 through the fifteenth contact hole CNT15.

The display device 1 according to the embodiment of FIG. 22 differs from the embodiment of FIGS. 8 and 10 in that the electrode pads 1500 may be omitted. In a case that contact resistance may be minimized in areas where the pixel electrode PXE and the electrode pattern PXP contact the second data conductive layer 1400, the electrode pads 1500 may be omitted to reduce a number of steps required to manufacture the display device 1.

A display device according to an embodiment may include electrode patterns having the same electric potential as voltage wirings, and a common electrode of some pixels may be connected to the electrode patterns to suppress a voltage drop. A contact hole through which an electrode pattern and the voltage wirings may be connected may not overlap or face a hole through which the common electrode and the electrode pattern may be connected. Therefore, a space in which the wirings may be disposed may be secured in each pixel even though a large number of pixels may be provided in defining a high-resolution display device.

In concluding the detailed description, those skilled in the art will appreciate that many variations and modifications can be made to the disclosed embodiments without substantially departing from the principles of the embodiments, as described herein. Therefore, the disclosed embodiments are used in a generic and descriptive sense only and not for purposes of limitation.

What is claimed is:

1. A display device, comprising:
a substrate comprising a display area and an opening area located in the display area;
a data conductive layer disposed on the substrate, the data conductive layer comprising a source electrode disposed in the display area and a voltage wiring disposed in the opening area;
a protective layer disposed on the data conductive layer, the protective layer covering the source electrode and the voltage wiring;
a planarization layer disposed on the protective layer;
a pixel electrode layer disposed on the planarization layer, the pixel electrode layer comprising:
a pixel electrode connected to the source electrode through a first contact hole penetrating the planarization layer and the protective layer; and
an electrode pattern connected to the voltage wiring through a second contact hole penetrating the planarization layer and the protective layer;
a pixel defining layer disposed on the planarization layer and the pixel electrode layer, the pixel defining layer comprising:
an opening exposing a portion of the pixel electrode; and
a hole at least partially exposing the electrode pattern;
a light emitting layer disposed on the pixel defining layer; and
a common electrode disposed on the light emitting layer, wherein
the hole does not overlap the first contact hole and the second contact hole in a thickness direction of the display device, and
the electrode pattern comprises:
a first electrode pattern having at least a portion thereof exposed by the hole; and
a second electrode pattern not exposed by the hole.

2. The display device of claim 1, wherein the electrode pattern comprises:
a first expanded portion having a first width; and
a protruding portion protruding from a side of the first expanded portion and having a width smaller than the first width.

3. The display device of claim 2, wherein the first width of the first expanded portion of the electrode pattern is greater than a second width of the hole.

4. The display device of claim 3, wherein the second width of the hole is greater than a third width of the second contact hole.

5. The display device of claim 4, wherein the third width of the second contact hole is different from a fourth width of the first contact hole.

6. The display device of claim 2, wherein the hole overlaps the first expanded portion of the electrode pattern in the thickness direction of the display device.

7. The display device of claim 6, wherein the second contact hole overlaps the protruding portion of the electrode pattern in the thickness direction of the display device.

8. The display device of claim 7, wherein the electrode pattern does not overlap the first contact hole in the thickness direction of the display device.

9. The display device of claim 2, wherein the voltage wiring comprises:
a second expanded portion overlapping the first expanded portion in the thickness direction of the display device; and
a first extension portion extending from a side of the second expanded portion,
wherein the second contact hole overlaps the first extension portion of the voltage wiring in the thickness direction of the display device.

10. The display device of claim 1,
wherein the common electrode contacts the first electrode pattern and does not contact the second electrode pattern.

11. The display device of claim 10, wherein the light emitting layer is disposed between the common electrode and the pixel electrode exposed by the opening and is not disposed on the first electrode pattern exposed by the hole.

12. The display device of claim 10, wherein the voltage wiring comprises:
a first voltage wiring connected to the first electrode pattern; and
a second voltage wiring connected to the second electrode pattern.

13. The display device of claim 1, wherein the data conductive layer comprises:
a first data conductive layer; and
a second data conductive layer disposed on the first data conductive layer,
wherein the protective layer comprises:
a first protective layer disposed between the first data conductive layer and the second data conductive layer; and
a second protective layer disposed between the second data conductive layer and the planarization layer.

14. The display device of claim 13, wherein the second data conductive layer is connected to the first data conductive layer through a third contact hole penetrating the first protective layer.

15. The display device of claim 14, wherein the third contact hole does not overlap the second contact hole in the thickness direction of the display device.

16. The display device of claim 14, wherein the pixel electrode contacts the source electrode of the second data conductive layer through the first contact hole, and
the electrode pattern contacts the voltage wiring of the second conductive layer through the second contact hole.

17. The display device of claim 16, further comprising:
a first electrode pad disposed on the second protective layer and the second data conductive layer, the first electrode pad contacting the source electrode of the second data conductive layer; and
a second electrode pad disposed on the second protective layer and the second data conductive layer, the second electrode pad contacting the voltage wiring of the second data conductive layer,
wherein the pixel electrode contacts the first electrode pad, and the electrode pattern contacts the second electrode pad.

18. A display device comprising:
a plurality of pixels, each of which includes an opening area;
a voltage wiring disposed in the opening areas of the pixels, the voltage wiring comprising:
a first expanded portion; and
a first extension portion extending from a side of the first expanded portion;
an electrode pattern disposed in the opening areas of the pixels, the electrode pattern comprising:
a second expanded portion overlapping the first expanded portion in a thickness direction of the display device; and
a protruding portion protruding from a side of the second expanded portion;
a pixel defining layer disposed on the second expanded portion of the electrode pattern, the pixel defining layer comprising a hole exposing at least a portion of the second expanded portion; and
a common electrode disposed on the pixel defining layer, the common electrode contacting the exposed second expanded portion of the electrode pattern,
wherein the voltage wiring and the electrode pattern are connected to each other through a contact hole, and the contact hole and the hole do not overlap each other in the thickness direction of the display device.

19. The display device of claim 18, wherein a width of the hole is smaller than a width of the second expanded portion of the electrode pattern and greater than a width of the contact hole.

20. The display device of claim 19, wherein the contact hole overlaps the protruding portion of the electrode pattern and the first extension portion of the voltage wiring, and
the protruding portion of the electrode pattern is connected to the first extension portion of the voltage wiring.

* * * * *